United States Patent
Miyata et al.

(10) Patent No.: US 8,916,229 B2
(45) Date of Patent: Dec. 23, 2014

(54) SUBSTRATE PROCESSING METHOD

(75) Inventors: Akira Miyata, Koshi (JP); Kenichirou Matsuyama, Koshi (JP); Kunie Ogata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 210 days.

(21) Appl. No.: 13/215,842

(22) Filed: Aug. 23, 2011

(65) Prior Publication Data

US 2012/0058253 A1 Mar. 8, 2012

(30) Foreign Application Priority Data

Sep. 6, 2010 (JP) ................................. 2010-198888
Jul. 12, 2011 (JP) ................................. 2011-154043

(51) Int. Cl.
*B05D 5/12* (2006.01)
*H01L 21/67* (2006.01)

(52) U.S. Cl.
CPC ............ *H01L 21/67126* (2013.01); *B05D 5/12* (2013.01); *H01L 21/6715* (2013.01); *H01L 21/67225* (2013.01); *H01L 21/6723* (2013.01)
USPC .......................... 427/8; 427/9; 427/10; 427/58

(58) Field of Classification Search
CPC ........ B05C 11/00; G06F 19/00; G03B 27/52; H01L 21/00
USPC .................................................. 427/8–10, 58
See application file for complete search history.

(56) References Cited

U.S. PATENT DOCUMENTS

| 7,241,061 B2* | 7/2007 | Akimoto et al. ............. 396/611 |
| 7,496,423 B2* | 2/2009 | Bachrach ...................... 700/112 |
| 7,905,668 B2* | 3/2011 | Yamamoto ................... 396/578 |
| 2003/0133086 A1* | 7/2003 | Senba et al. ................... 355/27 |
| 2006/0162858 A1* | 7/2006 | Akimoto et al. ........... 156/272.8 |
| 2006/0276046 A1* | 12/2006 | Hayashida et al. ........... 438/737 |
| 2007/0219660 A1* | 9/2007 | Kaneko et al. ................ 700/100 |
| 2007/0250202 A1* | 10/2007 | Kaneko et al. ................ 700/121 |
| 2008/0212048 A1* | 9/2008 | Araki .............................. 355/30 |
| 2008/0299502 A1* | 12/2008 | Shin et al. ..................... 430/324 |

FOREIGN PATENT DOCUMENTS

| JP | 2000-124301 | * | 4/2000 |
| JP | 2003-318079 A | | 11/2003 |
| JP | 2007-115831 A | | 5/2007 |
| JP | 2008-098670 A | | 4/2008 |
| JP | 2008-244072 | * | 10/2008 |
| JP | 2009-076893 A | | 4/2009 |
| JP | 2009-164256 A | | 7/2009 |

* cited by examiner

*Primary Examiner* — Brian K Talbot

(74) *Attorney, Agent, or Firm* — Abelman, Frayne & Schwab

(57) ABSTRACT

Provided is a substrate processing apparatus in which after a module is disabled, a substrate is provided to a carry-in module capable of placing the wafers most rapidly in the plurality of unit blocks and the substrates are sequentially transported to the module group by the transportation means to be delivered to the carry-out module according to a providing sequence of the substrate to the carry-in module in each of the plurality of unit blocks. In particular, the substrates are extracted from the carry-out module according to a providing sequence of the substrate to the carry-in module and transported to a rear module or a substrate placing part. Thereafter, the substrates are transported to the rear module from the carry-out module or the substrate placing part according to a predetermined sequence in which the substrate is provided to the carry-in module in a normal state.

5 Claims, 26 Drawing Sheets

FIG. 6

| | SCPW31 | SCPW32 | COT11 | COT12 | CPHP31 | CPHP32 | CPHP33 | CPHP34 | TRS31 | TRS32 | TIME s |
|---|---|---|---|---|---|---|---|---|---|---|---|
| | W1 | | | | | | | | | | |
| | ↓ | W3 | | | | | | | | | |
| 1 | W5 | ↓ | W1 | | | | | | | | 5.6 |
| 2 | ↓ | W7 | ↓ | W3 | | | | | | | 24 |
| 3 | W9 | ↓ | W5 | ↓ | W1 | | | | | | 27.2 |
| 4 | ↓ | W11 | ↓ | W7 | ↓ | W3 | | | | | 24 |
| 5 | W13 | ↓ | W9 | ↓ | ↓ | ↓ | W5 | | | | 24 |
| 6 | ↓ | W15 | ↓ | W11 | ↓ | ↓ | ↓ | W7 | | | 24 |
| 7 | W17 | ↓ | W13 | ↓ | W9 | ↓ | ↓ | ↓ | W1 | | 26.4 |
| 8 | ↓ | W19 | ↓ | W15 | ↓ | W11 | ↓ | ↓ | | W3 | 24 |
| 9 | W21 | ↓ | W17 | ↓ | ↓ | ↓ | W13 | ↓ | W5 | | 24 |
| 10 | ↓ | W23 | ↓ | W19 | ↓ | ↓ | ↓ | W15 | | W7 | 24 |
| 11 | W25 | ↓ | W21 | ↓ | W17 | ↓ | ↓ | ↓ | W9 | | 24 |
| 12 | ↓ | W27 | ↓ | W23 | ↓ | W19 | ↓ | ↓ | | W11 | 24 |
| 13 | W29 | ↓ | W25 | ↓ | ↓ | ↓ | W21 | ↓ | W13 | | 24 |
| 14 | ↓ | W31 | ↓ | W27 | ↓ | ↓ | ↓ | W23 | | W15 | 24 |
| 15 | W33 | ↓ | W29 | ↓ | W25 | ↓ | ↓ | ↓ | W17 | | 24 |
| 16 | ↓ | W35 | ↓ | W31 | ↓ | W27 | ↓ | ↓ | | W19 | 24 |
| 17 | W37 | ↓ | W33 | ↓ | ↓ | ↓ | W29 | ↓ | W21 | | 24 |
| 18 | ↓ | W39 | ↓ | W35 | ↓ | ↓ | ↓ | W31 | | W23 | 24 |
| 19 | W41 | ↓ | W37 | ↓ | W33 | ↓ | ↓ | ↓ | W25 | | 24 |
| 20 | ↓ | W43 | ↓ | W39 | ↓ | W35 | ↓ | ↓ | | W27 | 24 |
| 21 | W45 | ↓ | W41 | ↓ | ↓ | ↓ | W37 | ↓ | W29 | | 24 |
| 22 | ↓ | W47 | ↓ | W43 | ↓ | ↓ | ↓ | W39 | | W31 | 24 |
| 23 | W49 | ↓ | W45 | ↓ | W41 | ↓ | ↓ | ↓ | W33 | | 24 |
| 24 | | ↓ | | W47 | ↓ | W43 | ↓ | ↓ | | W35 | 24 |
| 25 | | | W49 | ↓ | ↓ | ↓ | W45 | ↓ | W37 | | 24 |
| 26 | | | | ↓ | ↓ | ↓ | ↓ | W47 | | W39 | 24 |
| 27 | | | | | W49 | ↓ | ↓ | ↓ | W41 | | 24 |
| 28 | | | | | | ↓ | ↓ | ↓ | | W43 | 23.2 |
| 29 | | | | | | | ↓ | ↓ | W45 | | 24 |
| 30 | | | | | | | | ↓ | | W47 | 24 |
| 31 | | | | | | | | | W49 | | 24 |

*FIG. 7*

| | SCPW41 | SCPW42 | COT21 | COT22 | CPHP41 | CPHP42 | CPHP43 | CPHP44 | TRS41 | TRS42 | TIME s |
|---|---|---|---|---|---|---|---|---|---|---|---|
| | W2 | | | | | | | | | | |
| | ↓ | W4 | | | | | | | | | |
| 1 | W6 | ↓ | W2 | | | | | | | | 5.6 |
| 2 | ↓ | W8 | ↓ | W4 | | | | | | | 24 |
| 3 | W10 | ↓ | W6 | ↓ | W2 | | | | | | 27.2 |
| 4 | ↓ | W12 | ↓ | W8 | ↓ | W4 | | | | | 24 |
| 5 | W14 | ↓ | W10 | ↓ | ↓ | ↓ | W6 | | | | 24 |
| 6 | ↓ | W16 | ↓ | W12 | ↓ | ↓ | ↓ | W8 | | | 24 |
| 7 | W18 | ↓ | W14 | ↓ | W10 | ↓ | ↓ | ↓ | W2 | | 26.4 |
| 8 | ↓ | W20 | ↓ | W16 | ↓ | W12 | ↓ | ↓ | | W4 | 24 |
| 9 | W22 | ↓ | W18 | ↓ | ↓ | ↓ | W14 | ↓ | W6 | | 24 |
| 10 | ↓ | W24 | ↓ | W20 | ↓ | ↓ | ↓ | W16 | | W8 | 24 |
| 11 | W26 | ↓ | W22 | ↓ | W18 | ↓ | ↓ | ↓ | W10 | | 24 |
| 12 | ↓ | W28 | ↓ | W24 | ↓ | W20 | ↓ | ↓ | | W12 | 24 |
| 13 | W30 | ↓ | W26 | ↓ | ↓ | ↓ | W22 | ↓ | W14 | | 24 |
| 14 | ↓ | W32 | ↓ | W28 | ↓ | ↓ | ↓ | W24 | | W16 | 24 |
| 15 | W34 | ↓ | W30 | ↓ | W26 | ↓ | ↓ | ↓ | W18 | | 24 |
| 16 | ↓ | W36 | ↓ | W32 | ↓ | W28 | ↓ | ↓ | | W20 | 24 |
| 17 | W38 | ↓ | W34 | ↓ | ↓ | ↓ | W30 | ↓ | W22 | | 24 |
| 18 | ↓ | W40 | ↓ | W36 | ↓ | ↓ | ↓ | W32 | | W24 | 24 |
| 19 | W42 | ↓ | W38 | ↓ | W34 | ↓ | ↓ | ↓ | W26 | | 24 |
| 20 | ↓ | W44 | ↓ | W40 | ↓ | W36 | ↓ | ↓ | | W28 | 24 |
| 21 | W46 | ↓ | W42 | ↓ | ↓ | ↓ | W38 | ↓ | W30 | | 24 |
| 22 | ↓ | W48 | ↓ | W44 | ↓ | ↓ | ↓ | W40 | | W32 | 24 |
| 23 | W50 | ↓ | W46 | ↓ | W42 | ↓ | ↓ | ↓ | W34 | | 24 |
| 24 | ↓ | | ↓ | W48 | ↓ | W44 | ↓ | ↓ | | W36 | 24 |
| 25 | | | W50 | ↓ | ↓ | ↓ | W46 | ↓ | W38 | | 24 |
| 26 | | | ↓ | ↓ | ↓ | ↓ | ↓ | W48 | | W40 | 24 |
| 27 | | | | W50 | ↓ | ↓ | ↓ | ↓ | W42 | | 24 |
| 28 | | | | ↓ | | ↓ | ↓ | ↓ | | W44 | 24 |
| 29 | | | | ↓ | | | ↓ | ↓ | W46 | | 23.2 |
| 30 | | | | ↓ | | | | ↓ | | W48 | 24 |
| 31 | | | | | | | | | W50 | | 24 |

FIG. 11

| | SCPW31 | SCPW32 | COT11 | COT12 | CPHP31 | CPHP32 | CPHP33 | CPHP34 | TRS31 | TRS32 | TIME s |
|---|---|---|---|---|---|---|---|---|---|---|---|
| | W1 | | | | | | | | | | |
| | ↓ | W3 | | | | | | | | | |
| 1 | W5 | ↓ | W1 | | | | | | | | 5.6 |
| 2 | ↓ | W7 | ↓ | W3 | | | | | | | 24 |
| 3 | W9 | ↓ | W5 | ↓ | W1 | | | | | | 27.2 |
| 4 | ↓ | W11 | ↓ | W7 | ↓ | W3 | | | | | 24 |
| 5 | W13 | ↓ | W9 | ↓ | ↓ | ↓ | W5 | | | | 24 |
| 6 | ↓ | W15 | ↓ | W11 | ↓ | ↓ | ↓ | W7 | | | 24 |
| 7 | W17 | ↓ | W13 | ↓ | W9 | ↓ | ↓ | ↓ | W1 | | 26.4 |
| 8 | ↓ | W19 | ↓ | W15 | ↓ | W11 | ↓ | ↓ | | W3 | 24 |
| 9 | W21 | ↓ | W17 | ↓ | ↓ | ↓ | W13 | ↓ | W5 | | 24 |
| 10 | ↓ | W23 | ↓ | W19 | ↓ | ↓ | ↓ | W15 | | W7 | 24 |
| 11 | W25 | ↓ | W21 | ↓ | W17 | ↓ | ↓ | ↓ | W9 | | 24 |
| 12 | ↓ | W27 | ↓ | W23 | ↓ | W19 | ↓ | ↓ | | W11 | 24 |
| 13 | W29 | ↓ | W25 | ↓ | ↓ | ↓ | W21 | ↓ | W13 | | 24 |
| 14 | ↓ | W31 | ↓ | W27 | ↓ | ↓ | ↓ | W23 | | W15 | 24 |
| 15 | ↓ | ↓ | ↓ | ↓ | ↓ | ↓ | ↓ | ↓ | | | 0 |
| 16 | ↓ | ↓ | ↓ | ↓ | ↓ | ↓ | ↓ | ↓ | | | 0 |
| 17 | W33 | ↓ | W29 | ↓ | ↓ | W25 | ↓ | ↓ | | W19 | 48 |
| 18 | ↓ | W35 | ↓ | W31 | ↓ | ↓ | W27 | ↓ | W21 | | 24 |
| 19 | W37 | ↓ | W33 | ↓ | ↓ | ↓ | ↓ | W29 | | W23 | 24 |
| 20 | ↓ | W39 | ↓ | W35 | ↓ | W31 | ↓ | ↓ | W25 | | 48 |
| 21 | W42 | ↓ | W37 | ↓ | ↓ | ↓ | W33 | ↓ | | W27 | 24 |
| 22 | ↓ | W45 | ↓ | W39 | ↓ | ↓ | ↓ | W35 | W29 | | 24 |
| 23 | W47 | ↓ | W42 | ↓ | ↓ | W37 | ↓ | ↓ | | W31 | 48 |
| 24 | ↓ | W50 | ↓ | W45 | ↓ | ↓ | W39 | ↓ | W33 | | 24 |
| 25 | | ↓ | W47 | ↓ | ↓ | ↓ | ↓ | W42 | | W35 | 24 |
| 26 | | | ↓ | W50 | ↓ | W45 | ↓ | ↓ | W37 | | 48 |
| 27 | | | | ↓ | ↓ | ↓ | W47 | ↓ | | W39 | 24 |
| 28 | | | | | ↓ | ↓ | W50 | W42 | | | 24 |
| 29 | | | | | ↓ | ↓ | ↓ | ↓ | | W45 | 47.2 |
| 30 | | | | | ↓ | | | ↓ | W47 | | 24 |
| 31 | | | | | ↓ | | | | W50 | | 24 |
| 32 | | | | | ↓ | | | | | | |

FIG.12

| | SCPW41 | SCPW42 | COT21 | COT22 | CPHP41 | CPHP42 | CPHP43 | CPHP44 | TRS41 | TRS42 | TIME s |
|---|---|---|---|---|---|---|---|---|---|---|---|
| | W2 | | | | | | | | | | |
| | ↓ | W4 | | | | | | | | | |
| 1 | W6 | ↓ | W2 | | | | | | | | 5.6 |
| 2 | ↓ | W8 | ↓ | W4 | | | | | | | 24 |
| 3 | W10 | ↓ | W6 | ↓ | W2 | | | | | | 27.2 |
| 4 | ↓ | W12 | ↓ | W8 | ↓ | W4 | | | | | 24 |
| 5 | W14 | ↓ | W10 | ↓ | ↓ | ↓ | W6 | | | | 24 |
| 6 | ↓ | W16 | ↓ | W12 | ↓ | ↓ | ↓ | W8 | | | 24 |
| 7 | W18 | ↓ | W14 | ↓ | W10 | ↓ | ↓ | ↓ | W2 | | 26.4 |
| 8 | ↓ | W20 | ↓ | W16 | ↓ | W12 | ↓ | ↓ | | W4 | 24 |
| 9 | W22 | ↓ | W18 | ↓ | ↓ | ↓ | W14 | ↓ | W6 | | 24 |
| 10 | ↓ | W24 | ↓ | W20 | ↓ | ↓ | ↓ | W16 | | W8 | 24 |
| 11 | W26 | ↓ | W22 | ↓ | W18 | ↓ | ↓ | ↓ | W10 | | 24 |
| 12 | ↓ | W28 | ↓ | W24 | ↓ | W20 | ↓ | ↓ | | W12 | 24 |
| 13 | W30 | ↓ | W26 | ↓ | ↓ | ↓ | W22 | ↓ | W14 | | 24 |
| 14 | ↓ | W32 | ↓ | W28 | ↓ | ↓ | ↓ | W24 | | W16 | 24 |
| 15 | W34 | ↓ | W30 | ↓ | W26 | ↓ | ↓ | ↓ | W18 | | 24 |
| 16 | ↓ | W36 | ↓ | W32 | ↓ | W28 | ↓ | ↓ | | W20 | 24 |
| 17 | W38 | ↓ | W34 | ↓ | ↓ | ↓ | W30 | ↓ | W22 | | 24 |
| 18 | ↓ | W40 | ↓ | W36 | ↓ | ↓ | ↓ | W32 | | W24 | 24 |
| 19 | W41 | ↓ | W38 | ↓ | W34 | ↓ | ↓ | ↓ | W26 | | 24 |
| 20 | ↓ | W43 | ↓ | W40 | ↓ | W36 | ↓ | ↓ | | W28 | 24 |
| 21 | W44 | ↓ | W41 | ↓ | ↓ | ↓ | W38 | ↓ | W30 | | 24 |
| 22 | ↓ | W46 | ↓ | W43 | ↓ | ↓ | ↓ | W40 | | W32 | 24 |
| 23 | W48 | ↓ | W44 | ↓ | W41 | ↓ | ↓ | ↓ | W34 | | 24 |
| 24 | ↓ | W49 | ↓ | W46 | ↓ | W43 | ↓ | ↓ | | W36 | 24 |
| 25 | | ↓ | W48 | ↓ | ↓ | ↓ | W44 | ↓ | W38 | | 24 |
| 26 | | ↓ | W49 | ↓ | ↓ | ↓ | ↓ | W46 | | W40 | 24 |
| 27 | | | | ↓ | W48 | ↓ | ↓ | ↓ | W41 | | 24 |
| 28 | | | | | ↓ | W49 | ↓ | ↓ | | W43 | 24 |
| 29 | | | | | ↓ | ↓ | ↓ | ↓ | W44 | | 23.2 |
| 30 | | | | | ↓ | ↓ | | | | W46 | 24 |
| 31 | | | | | | ↓ | | | W48 | | 24 |
| 32 | | | | | | | | | | W49 | 24 |

FIG. 13

| | SCPW31 | SCPW32 | COT11 | COT12 | CPHP31 | CPHP32 | CPHP33 | CPHP34 | TRS31 | TRS32 | TIME s |
|---|---|---|---|---|---|---|---|---|---|---|---|
| | W1 | | | | | | | | | | |
| | ↓ | W3 | | | | | | | | | |
| 1 | W5 | ↓ | W1 | | | | | | | | 5.6 |
| 2 | ↓ | W7 | ↓ | W3 | | | | | | | 24 |
| 3 | W9 | ↓ | W5 | ↓ | W1 | | | | | | 27.2 |
| 4 | ↓ | W11 | ↓ | W7 | ↓ | W3 | | | | | 24 |
| 5 | W13 | ↓ | W9 | ↓ | ↓ | ↓ | W5 | | | | 24 |
| 6 | ↓ | W15 | ↓ | W11 | ↓ | ↓ | ↓ | W7 | | | 24 |
| 7 | W17 | ↓ | W13 | ↓ | W9 | ↓ | ↓ | ↓ | W1 | | 26.4 |
| 8 | ↓ | W19 | ↓ | W15 | ↓ | W11 | ↓ | ↓ | | W3 | 24 |
| 9 | W21 | ↓ | W17 | ↓ | ↓ | ↓ | W13 | ↓ | W5 | | 24 |
| 10 | ↓ | W23 | ↓ | W19 | ↓ | ↓ | ↓ | W15 | | W7 | 24 |
| 11 | W25 | ↓ | W21 | ↓ | W17 | ↓ | ↓ | ↓ | W9 | | 24 |
| 12 | ↓ | W27 | ↓ | W23 | ↓ | W19 | ↓ | ↓ | | W11 | 24 |
| 13 | W29 | ↓ | W25 | ↓ | ↓ | ↓ | W21 | ↓ | W13 | | 24 |
| 14 | ↓ | W31 | ↓ | W27 | ↓ | ↓ | ↓ | W23 | | W15 | 24 |
| 15 | ↓ | ↓ | ↓ | ↓ | ↓ | ↓ | ↓ | ↓ | | | 0 |
| 16 | ↓ | ↓ | ↓ | ↓ | ↓ | ↓ | ↓ | ↓ | | | 0 |
| 17 | W33 | ↓ | W29 | ↓ | ↓ | W25 | ↓ | ↓ | | W19 | 48 |
| 18 | ↓ | W35 | ↓ | W31 | ↓ | ↓ | W27 | ↓ | W21 | | 24 |
| 19 | W37 | ↓ | W33 | ↓ | ↓ | ↓ | ↓ | W29 | | W23 | 24 |
| 20 | ↓ | W39 | ↓ | W35 | ↓ | W31 | ↓ | ↓ | W25 | | 48 |
| 21 | W41 | ↓ | W37 | ↓ | ↓ | ↓ | W33 | ↓ | | W27 | 24 |
| 22 | ↓ | W43 | ↓ | W39 | ↓ | ↓ | ↓ | W35 | W29 | | 24 |
| 23 | W45 | ↓ | W41 | ↓ | ↓ | W37 | ↓ | ↓ | | W31 | 48 |
| 24 | ↓ | W47 | ↓ | W43 | ↓ | ↓ | W39 | ↓ | W33 | | 24 |
| 25 | W49 | ↓ | W45 | ↓ | ↓ | ↓ | ↓ | W41 | | W35 | 24 |
| 26 | ↓ | ↓ | ↓ | W47 | ↓ | W43 | ↓ | ↓ | W37 | | 48 |
| 27 | | ↓ | W49 | ↓ | ↓ | ↓ | W45 | ↓ | | W39 | 24 |
| 28 | | ↓ | | ↓ | ↓ | ↓ | ↓ | W47 | W41 | | 24 |
| 29 | | | | | ↓ | W49 | ↓ | ↓ | | W43 | 48 |
| 30 | | | | | ↓ | ↓ | ↓ | ↓ | W45 | | 23.2 |
| 31 | | | | | ↓ | ↓ | | | | W47 | 24 |
| 32 | | | | | ↓ | | | | W49 | | 48 |

FIG. 14

| | SCPW41 | SCPW42 | COT21 | COT22 | CPHP41 | CPHP42 | CPHP43 | CPHP44 | TRS41 | TRS42 | TIME s |
|---|---|---|---|---|---|---|---|---|---|---|---|
| | W2 | | | | | | | | | | |
| | ↓ | W4 | | | | | | | | | |
| 1 | W6 | ↓ | W2 | | | | | | | | 5.6 |
| 2 | ↓ | W8 | ↓ | W4 | | | | | | | 24 |
| 3 | W10 | ↓ | W6 | ↓ | W2 | | | | | | 27.2 |
| 4 | ↓ | W12 | ↓ | W8 | ↓ | W4 | | | | | 24 |
| 5 | W14 | ↓ | W10 | ↓ | ↓ | ↓ | W6 | | | | 24 |
| 6 | ↓ | W16 | ↓ | W12 | ↓ | ↓ | ↓ | W8 | | | 24 |
| 7 | W18 | ↓ | W14 | ↓ | W10 | ↓ | ↓ | ↓ | W2 | | 26.4 |
| 8 | ↓ | W20 | ↓ | W16 | ↓ | W12 | ↓ | ↓ | | W4 | 24 |
| 9 | W22 | ↓ | W18 | ↓ | ↓ | ↓ | W14 | ↓ | W6 | | 24 |
| 10 | ↓ | W24 | ↓ | W20 | ↓ | ↓ | ↓ | W16 | | W8 | 24 |
| 11 | W26 | ↓ | W22 | ↓ | W18 | ↓ | ↓ | ↓ | W10 | | 24 |
| 12 | ↓ | W28 | ↓ | W24 | ↓ | W20 | ↓ | ↓ | | W12 | 24 |
| 13 | W30 | ↓ | W26 | ↓ | ↓ | ↓ | W22 | ↓ | W14 | | 24 |
| 14 | ↓ | W32 | ↓ | W28 | ↓ | ↓ | ↓ | W24 | | W16 | 24 |
| 15 | W34 | ↓ | W30 | ↓ | W26 | ↓ | ↓ | ↓ | W18 | | 24 |
| 16 | ↓ | W36 | ↓ | W32 | ↓ | W28 | ↓ | ↓ | | W20 | 24 |
| 17 | W38 | ↓ | W34 | ↓ | ↓ | ↓ | W30 | ↓ | W22 | | 24 |
| 18 | ↓ | W40 | ↓ | W36 | ↓ | ↓ | ↓ | W32 | | W24 | 24 |
| 19 | W42 | ↓ | W38 | ↓ | W34 | ↓ | ↓ | ↓ | W26 | | 24 |
| 20 | ↓ | W44 | ↓ | W40 | ↓ | W36 | ↓ | ↓ | | W28 | 24 |
| 21 | W46 | ↓ | W42 | ↓ | ↓ | ↓ | W38 | ↓ | W30 | | 47.8 |
| 22 | ↓ | W48 | ↓ | W44 | ↓ | ↓ | ↓ | W40 | | W32 | 24 |
| 23 | W50 | ↓ | W46 | ↓ | W42 | ↓ | ↓ | ↓ | W34 | | 24 |
| 24 | | ↓ | ↓ | W48 | ↓ | W44 | ↓ | ↓ | | W36 | 48 |
| 25 | | | W50 | ↓ | ↓ | ↓ | W46 | ↓ | W38 | | 24 |
| 26 | | | | ↓ | ↓ | ↓ | ↓ | W48 | | W40 | 23.2 |
| 27 | | | | W50 | ↓ | ↓ | ↓ | ↓ | W42 | | 24 |
| 28 | | | | | ↓ | ↓ | ↓ | ↓ | | W44 | 24 |
| 29 | | | | | | ↓ | | ↓ | W46 | | 24 |
| 30 | | | | | | ↓ | | | | W48 | 23.2 |
| 31 | | | | | | | | | W50 | | 24 |

SUBSTRATE PROCESSING METHOD

CROSS-REFERENCE TO RELATED APPLICATIONS

This application is based on and claims priority from Japanese Patent Application Nos. 2010-198888 and 2011-154043, filed on Sep. 6, 2010 and Jul. 12, 2011, respectively, with the Japanese Patent Office, the disclosures of which are incorporated herein in their entireties by reference.

TECHNICAL FILED

The present disclosure relates to a substrate processing apparatus and a substrate processing method that perform predetermined substrate processing, such as a coating of a resist liquid or a development processing after exposure by providing a processing liquid to the surface of a substrate such as a semiconductor wafer or an LCD substrate (a glass substrate for a liquid crystal display).

BACKGROUND

In a photoresist process as one of semiconductor manufacturing processes, resist is applied to the surface of a semiconductor wafer (hereinafter, referred to as a wafer), and then the resist is exposed and developed in a predetermined pattern to form a resist pattern. In a coating and developing apparatus for forming the resist pattern, a processing block including a processing module is provided for performing various processes with respect to a wafer.

The processing block is configured by stacking a unit block that forms various coating films such as a resist film and a unit block that performs development processing as disclosed, for example, in Japanese Patent Application Publication No. 2007-115831. A plurality of liquid processing modules applying a resist liquid or a development liquid, or a plurality of heating modules performing heating processing are inserted into the unit blocks.

In such a resist pattern forming apparatus, in order to improve the throughput, a plurality of unit blocks performing the same processing with respect to the wafer are provided and modules provided in the unit blocks are set as a multi-module in many cases. The multi-module refers to a plurality of modules that have the same transportation sequence and perform the same processing for the wafer. In addition, when the plurality of unit blocks performing the same processing are stacked, the wafers are provided to the unit blocks in sequence and processing is performed in each unit block, and thereafter, the wafers are carried out from each unit block according to the providing sequence, as disclosed in Japanese Patent Application Publication No. 2009-76893 (see, for example, claim 8).

In this case, the wafer is transported according to a previously prepared transportation schedule. Assuming that a place where the wafer is disposed is called a module, the transportation schedule is prepared by allocating the sequence to the wafers, and arranging transportation cycle data designating a transportation cycle in time series by making the sequence of the wafers and the sequence of the modules to correspond to each other.

However, in a unit block among the plurality of unit blocks performing the same processing, a module constituting the multi-modules may not sometimes be used due to a trouble or a maintenance. In this case, when a disabled module that cannot be used exists in a unit block, a throughput is deteriorated because an operation rate of the module decreases.

However, in the configuration where the wafers are provided to the plurality of unit blocks in sequence and processed wafers are carried out according to the providing sequence from each unit block as described above, the throughput is deteriorated even in other unit blocks.

For example, when two unit blocks are provided, wafers W are alternatively provided to the unit blocks from a first wafer W1 of a lot in sequence. That is, for example, first wafer W1, a third wafer W3, a fifth wafer W5, and the like of the lot are provided in sequence to unit block of one side, and a second wafer W2, a fourth wafer W4, a sixth wafer W6, and the like of the lot are provided in sequence to the unit block of the other-side.

Herein, as a case in which n liquid processing modules are provided in each unit block, when the trouble occurs in one liquid processing module of the unit block of one-side, the operation rate of the liquid processing module of the one-side unit block becomes (n−1)/n.

In addition, in the unit block of the other-side, since wafers W are alternatively provided between the unit blocks of one-side, and the order of wafers W carried out from each unit block is determined, there is a standby status in which providing the wafers to the one-side unit block or carrying out the wafers from the one-side unit block must be waited. For example, when the trouble occurs in the liquid processing module before a seventh wafer W7 of the lot is transported to the unit block of one-side, wafer W7 cannot be transported to the liquid processing module in which the trouble occurs in the original transportation cycle, and as a result, for example, wafer W7 is transported to another liquid processing module in a next transportation cycle.

Therefore, an eighth wafer W8 of the lot is provided to the unit block of the other-side after waiting for providing of wafer W7. As a result, even though n liquid processing modules can be used in other liquid processing module, there occurs liquid processing modules that are not operated, such that the operation rate of the liquid processing module become (n−1)/n.

Accordingly, total 2n liquid processing modules are inserted into two unit blocks and even when the trouble occurs in one liquid processing module, the operation rate of all the liquid processing modules becomes (2n−2)/2n and the throughput of the entire apparatus is deteriorated. In this case, when the providing sequence of the wafers to the unit blocks or the carry-out sequence of the wafers are changed, transportation control becomes very difficult and it is not realistic.

SUMMARY

According to an exemplary embodiment of the present disclosure, there is a substrate processing apparatus including a plurality of layers of unit blocks transporting substrates placed in a carry-in module to a module group in which each substrate is placed and a transportation sequence is determined by a transportation means one by one to be delivered to a carry-out module at a downstream end of the module group and performing the same processing with respect to the substrates, the apparatus comprises a multi module including a plurality of modules included in the module group, having the same transportation sequence, and performing the same processing with respect to the substrates; a rear module provided at a downstream side of the module group; a substrate placing part provided at the downstream side of the module group and configured to dispose a plurality of substrates; a first delivery means providing the substrates to each of carry-in modules of the plurality of unit blocks; a second delivery means configured to extract the substrates from each of carry-out modules of the plurality of unit blocks and transport the extracted substrates to the rear module and the substrate placing part; and a control part configured to control the transportation means and the first delivery means and the second delivery means. In particular, the control part is configured (1) to provide the substrates to each of the carry-in modules of the plurality of unit blocks by the first delivery means in a predetermined sequence in a normal state. The control part is further configured, when one or more modules of the multi module included in the unit block are disabled and one or more modules are usable, (2) (2-a) to provide the substrates to a carry-in module capable of placing the substrates most rapidly in the plurality of unit blocks by the first delivery means, after the module is disabled, (2-b) to transport the substrates sequentially to the module group by the transportation means to be delivered to the carry-out module according to a providing sequence of the substrates to the carry-in module in each of the plurality of unit blocks, (2-c) to extract the substrates from the carry-out module by the second delivery means according to the providing sequence of the substrates to the carry-in module, (2-d) to transport the substrates extracted from the carry-out module directly to the rear module by the second delivery means, or transport the substrates to the rear module after transporting the substrates to the substrate placing part first, thereby transporting the substrates to the rear module by the second delivery means according to a predetermined sequence in which the substrate is provided to the carry-in module by the first delivery means in the normal state.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a transportation schedule of a COT1 layer B3 in normal state.

FIG. 7 is a transportation schedule of a COT2 layer B4 in normal state.

FIG. 11 is a transportation schedule of COT1 layer B3 when a module is disabled.

FIG. 12 is a transportation schedule of COT2 layer B4 when a module is disabled.

FIG. 13 is a transportation schedule of COT1 layer B3 of a comparative example when a module is disabled.

FIG. 14 is a transportation schedule of COT2 layer B4 of a comparative example when a module is disabled.

DETAILED DESCRIPTION

Figure 1:
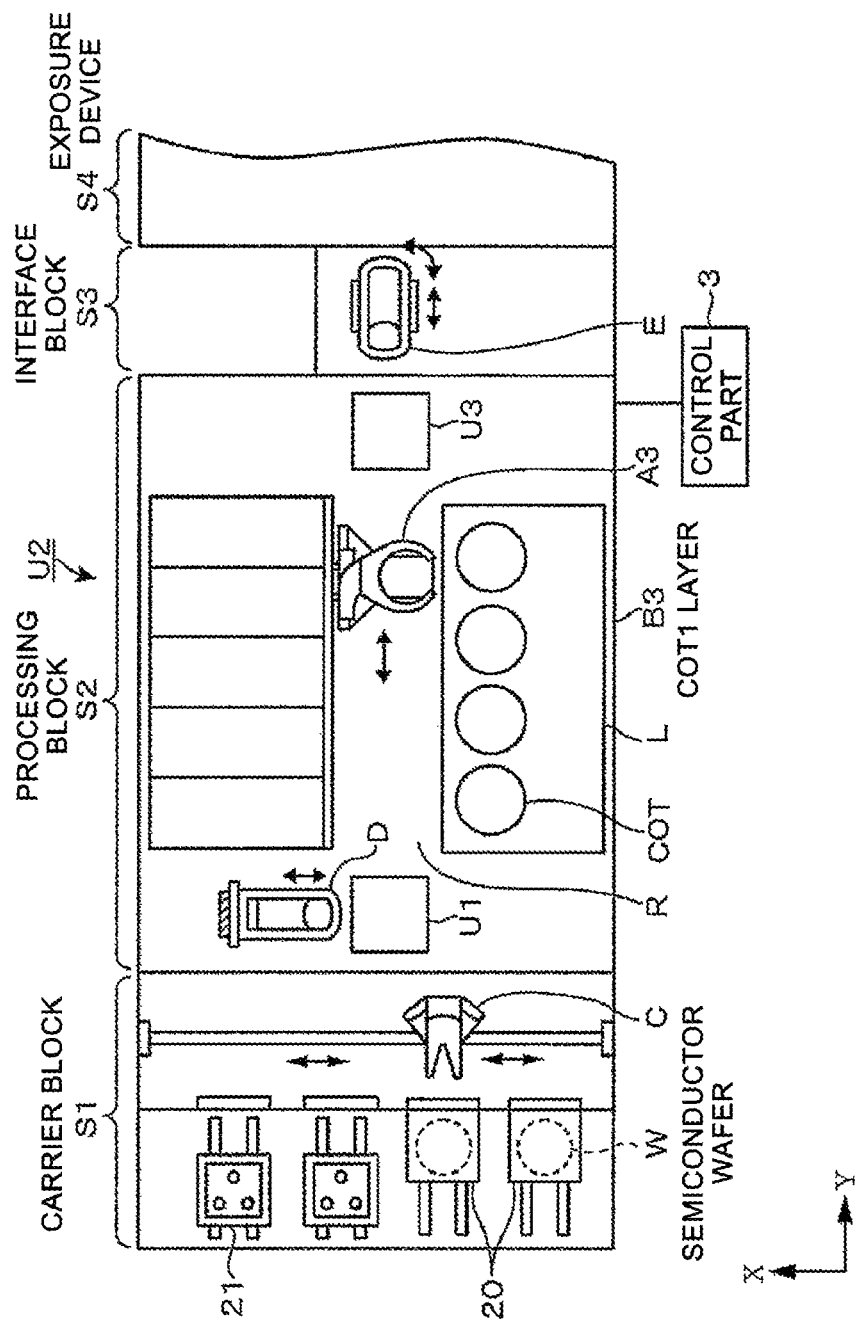
FIG. 1 is a plan view illustrating a resist pattern forming apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a technology capable of suppressing deterioration of a throughput when a module is disabled An exemplary embodiment of the present disclosure provides a substrate processing apparatus including a plurality of layers of unit blocks transporting substrates placed in a carry-in module to a module group in which each substrate is placed and a transportation sequence is determined by a transportation means one by one to be delivered to a carry-out module at a downstream end of the module group and performing the same processing with respect to the substrates, the apparatus comprises a multi module including a plurality of modules included in the module group, having the same transportation sequence, and performing the same processing with respect to the substrates; a rear module provided at a downstream side of the module group; a substrate placing part provided at the downstream side of the module group and configured to dispose a plurality of substrates; a first delivery means providing the substrates to each of carry-in modules of the plurality of unit blocks; a second delivery means configured to extract the substrates from each of carry-out modules of the plurality of unit blocks and transport the extracted substrates to the rear module and the substrate placing part; and a control part configured to control the transportation means and the first delivery means and the second delivery means. In particular, the control part is configured (1) to provide the substrates to each of the carry-in modules of the plurality of unit blocks by the first delivery means in a predetermined sequence in a normal state, and the control part is further configured, when one or more modules of the multi module included in the unit block are disabled and one or more modules are usable, (2) (2-a) to provide the substrates to a carry-in module capable of placing the substrates most rapidly in the plurality of unit blocks by the first delivery means, after the module is disabled, (2-b) to transport the substrates sequentially to the module group by the transportation means to be delivered to the carry-out module according to a providing sequence of the substrates to the carry-in module in each of the plurality of unit blocks, (2-c) to extract the substrates from the carry-out module by the second delivery means according to the providing sequence of the substrates to the carry-in module, (2-d) to transport the substrates extracted from the carry-out module directly to the rear module by the second delivery means, or transport the substrates to the rear module after transporting the substrates to the substrate placing part first, thereby transporting the substrates to the rear module by the second delivery means according to a predetermined sequence in which the substrate is provided to the carry-in module by the first delivery means in the normal state.

In the above substrate processing apparatus, in the unit block, a substrate is extracted from one module, a substrate of a next module is received and the previous substrate is delivered to the next module by the transportation means, such that the substrate placed in each module is shifted to a one-later module to execute one transportation cycle, and after the one transportation cycle is executed, the next transportation cycle is executed, and by sequentially executing each transportation cycle, the substrates are transported sequentially to a high-order module from a low-order module among the module groups to be subjected to predetermined processing. In particular, the control part includes a storing section configured to store a transportation schedule prepared by arranging transportation cycle data which allocates the sequence to the substrates and designates a transportation cycle in time series by making the sequence of the substrates and each module to correspond to each other, and a transportation controlling section configured to refer to the transportation schedule, and control the transportation means to transport the substrate recorded in the transportation cycle data to the module corresponding to the substrate to execute the transportation cycle. The control part is further configured, when one or more modules of the multi-module included in the unit block becomes disabled modules and one or more modules become usable, (3) (3-a) to re-record the transportation schedule so as not to transport the substrate to the disabled module in the unit block where the module is disabled, and (3-b) when the substrate which is carried in to the carry-in module in the plurality of unit blocks is different from a substrate placed in the carry-in module in the transportation cycle in the transportation schedule used at that time, to re-record the transportation schedule so that the substrate carried in to the carry-in module is the same as the substrate placed in the carry-in module in the transportation cycle.

In the above substrate processing apparatus, the substrate processing apparatus includes a coating and developing apparatus, that applies resist to the substrate and develops the substrate after the exposure process, comprising a module group to form a coating film on the substrate before an exposure process, a module group to perform a process including a development process to the substrate after an exposure process. In particular, each of the module group to form a coating film and the module group to perform a process including a development process is equipped with an exclusive transport path configured to transport the substrate between the module group. In particular, the module group in which each substrate is disposed with a transportation sequence is the module group configured to form a coating film before the exposure process.

In the above substate processing apparatus, the substrate processing apparatus includes a coating and developing apparatus, that applies resist to the substrate and develops the substrate after the exposure process, comprising a module group to form a coating film on the substrate before an exposure process, a module group to perform a process including development to the substrate after an exposure process. In particular, each of the module group to form a coating film and the module group to perform a process including development process is equipped with an exclusive transport path configured to transport the substrate between the module group, and the module group in which each substrate is disposed with a transportation sequence is the module group configured to perform a process including a development process after the exposure process.

In the above substrate processing substrate, in (2-c) as described above, the substrates are extracted from the carry-out module according to the providing sequence of the substrate to the carry-in module by the transportation means, rather than by the second delivery means, to be transported to the substrate placing part.

In the above substrate processing substrate, in (2-b) as described above, the substrates are sequentially transported to the module group to be delivered to the substrate placing part, rather than to the carry-out module, by the transportation means. In (2-c) as described above, the substrates are extracted from the substrate placing part, rather than from the carry-out module, by the second delivery means according to the providing sequence of the substrate to the carry-in module, and in (2-d) as described above, the substrate is transported to the rear module from the substrate placing part, rather than from the carry-out module or the substrate placing part, by the second delivery means.

In the above substate processing apparatus, the multi module is a coating film forming module configured to form the coating film on the substrate, the coating film forming module includes a coating film forming mechanism configured to apply a chemical liquid to the substrate in order to form the coating film, and a coating film removing mechanism configured to remove the coating film of the substrate carried in to the disabled module when the coating film forming module is the disabled module, and the operation (2) is performed except for the substrate.

In the above substate processing apparatus, the transportation means and the first delivery means operate to transport the substrate where the coating film is removed to a usable coating film forming module of the unit block including the disabled coating film forming module or a usable coating film forming module of another unit block in order to form the coating film again on the substrate where the coating film is removed by the coating film removing mechanism of the coating film forming module which is disabled, and the second delivery means transports the substrate where the coating film is formed again to the rear module.

Another exemplary embodiment of the present disclosure provides a substrate processing method by a substrate processing apparatus including a plurality of layers of unit blocks transporting substrates placed in a carry-in module to a module group in which each substrate is placed and a transportation sequence is determined by a transportation means one by one to be delivered to a carry-out module at a downstream end of the module group and performing the same processing with respect to the substrates, where the substrate processing apparatus includes a multi module including a plurality of modules included in the module group, having the same transportation sequence, and performing the same processing with respect to the substrates; a rear module provided at a downstream side of the module group; and a substrate placing part provided at the downstream side of the module group and configured to dispose a plurality of substrates. The method comprises (4) providing the substrates to each of carry-in modules of the plurality of unit blocks in a predetermined sequence in a normal state. The method further comprises when one or more modules of the multi module included in the unit block are disabled and one or more modules are usable in the multi module included in the unit block (5) (5-a) providing the substrates to a carry-in module capable of placing the substrates most rapidly in the plurality of unit blocks, after the module is disabled; (5-b) transporting the substrates sequentially to the module group by the transportation means to be delivered to the carry-out module according to a providing sequence of the substrates to the carry-in module in each of the plurality of unit blocks; (5-c) extracting the substrates from the carry-out module according to the providing sequence of the substrates to the carry-in module; and (5-d) transporting the substrates directly to the rear module from the carry-out module or transporting the substrates to the rear module after transporting the substrates to the substrate placing part first, thereby transporting the substrates to the rear module according to a predetermined sequence in which the substrates are provided to the carry-in module in the normal state.

The above substrate processing method further comprises allocating the sequence to the substrates, extracting the substrate from one module by the transportation means in the unit block so as to transport the substrate recorded in the transportation cycle data to the module corresponding to the substrate by referring to a transportation schedule prepared by arranging transportation cycle data designating a transportation cycle in time series by making the sequence of the substrate and each module to correspond to each other, receiving a substrate of a next module and delivering the previous substrate to the next module, such that the substrate placed in each module is shifted to a one-later module to execute one transportation cycle, and after the one transportation cycle is executed, executing the next transportation cycle, and by sequentially executing each transportation cycle, transporting the substrates sequentially to a high-order module from a low-order module among the module groups to be subjected to predetermined processing. The method further comprising, when one or more modules becomes the disabled modules and one or more modules become the usable modules in the multi-module included in the unit block, (6) (6-a) re-recording the transportation schedule so as not to transport the substrate to the disabled module in the unit block where the module is disabled, (6-b) when the substrate which is carried in to the carry-in module is different from a substrate placed in the carry-in module in the transportation cycle in the plurality of unit blocks in the transportation schedule used at that time, re-recording the transportation schedule so that the substrate carried in to the carry-in module is the same as the substrate placed in the carry-in module in the transportation cycle.

In the above substrate processing method, the multi module is a coating film forming module configured to form the coating film on the substrate, and the method further comprises forming the coating film by applying a chemical liquid to the substrate by a coating film forming mechanism provided in a coating film forming module and removing the coating film of the substrate carried in to the disabled module by using the coating film removing mechanism when the coating film forming module is the disabled module, and the operation (5) is performed except for the substrate.

The above substrate processing method further comprises: transporting the substrate where the coating film is removed by the coating film removing mechanism of the disabled coating film forming module to a usable coating film forming module of the unit block including the disabled coating film forming module or a usable coating film forming module of another unit block; forming the coating film on the substrate again in the coating film forming module; and transporting the substrate where the coating film is formed again to the rear module.

According to exemplary embodiments of the present disclosure, a plurality of layers of processing blocks performing the same processing with respect to a substrate are provided and one or more modules among a plurality of modules constituting multi-modules with respect to any processing block are disabled modules and further, when one or more modules can be used, the substrate is transported to a carry-in module capable of carrying in the substrate most rapidly among carry-in modules of the plurality of processing blocks. As a result, a time when the substrate is waiting for transportation to the carry-in module can be shortened and deterioration of a throughput can be suppressed.

Figure 2:
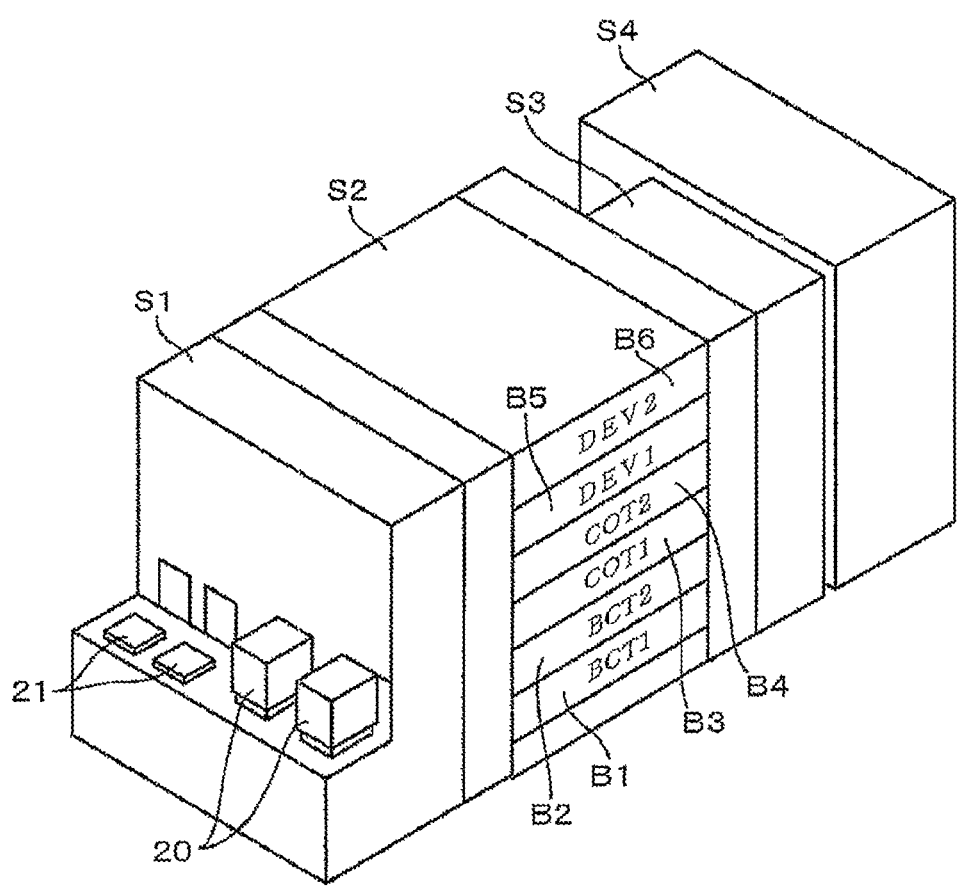
FIG. 2 is a perspective view illustrating the resist pattern forming apparatus.

Hereinafter, an example of a resist pattern forming apparatus in which an exposure device is connected to a coating and developing apparatus of the present disclosure will be described in brief with reference to the accompanying drawings. FIG. 1 is a plan view illustrating a resist pattern forming apparatus according to an exemplary embodiment of the present disclosure and FIG. 2 is a schematic perspective view illustrating the resist pattern forming apparatus. The apparatus includes a carrier block S1, a processing block S2, an interface block S3, and an exposure device S4. In carrier block S1, a delivery arm C extracts a wafer W from a hermetical carrier 20 placed on a placing table 21 and carries the extracted wafer W to the processing block S2 adjacent to carrier block S1. Delivery arm C receives wafer W which is processed in processing block S2 and returns the processed wafer W to carrier 20.

In processing block S2, a plurality of, for example, six unit blocks are stacked on each other and for example, a plurality of coating film forming unit blocks forming a coating film and a plurality of, for example, two development processing unit blocks (DEV1 layer B5 and DEV2 layer B6) performing development processing are stacked on each other. In this example, as for the coating film forming unit blocks, for example, two anti-reflecting film forming unit blocks (BCT1 layer B1 and BCT2 layer B2) forming an anti-reflecting film formed on a lower layer of a resist film and for example, and two resist film forming unit blocks (COT1 layer B3 and COT2 layer B4) forming a resist film are provided.

COT1 layer B3, COT2 layer B4, DEV1 layer B5, and DEV2 layer B6, are configured substantially similar to each other and include a shelf unit U1 in which a carrying module or a buffer module for carrying wafer W between different unit blocks is placed in a multi-stage, a liquid processing module group L including a plurality of liquid processing modules each applying a chemical liquid, a shelf unit U2 in which modules of a heating and cooling system for pre-processing and post-processsing of the processing performed by liquid processing module group L are placed in a multi-stage, and transportation arms A3 to A6 constituted by transportation means delivering wafer W between each section of shelf units U1 and U2 and each module of liquid processing group L.

As shown in FIG. 1 by using COT1 layer B3 as an example, a transport path R extending in a Y direction in the figure is provided for each of COT1 layer B3, COT2 layer B4, DEV1 layer B5, and DEV2 layer B6. Transportation arms A3 to A6 are configured to be retractable, elevatable, rotatable around a vertical axis, and movable in the Y-axis direction on transport path R in the figure, and include two forks for supporting a circumferential edge region on a rear surface of wafer W and the forks are configured to be retractable independently from each other.

Liquid processing module group L and shelf unit U2 are placed to face each other on transport path R. Further, in liquid processing module group L, a plurality of, for example, four liquid processing modules are arranged in parallel on transport path R. As for the liquid processing modules, liquid processing modules COT applying a resist liquid are provided in COT1 layer B3 and COT2 layer B4 and the development modules DEV applying a development liquid are provided in DEV1 layer B5 and DEV2 layer B6.

Figure 3:
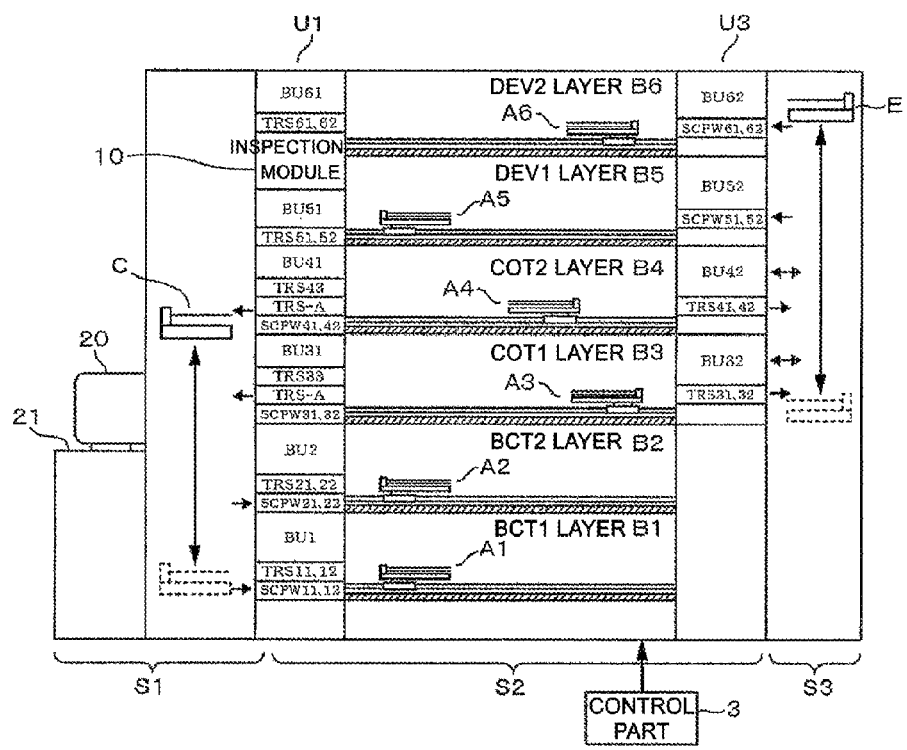
FIG. 3 is a vertically cross-sectional side view illustrating the resist pattern forming apparatus.

Shelf unit U1 is configured to transport wafer W between the sections of shelf unit U1 by an elevatable and retractable delivery arm D which is provided in the vicinity of shelf unit U1 as shown in FIGS. 1 and 3. In shelf unit U1, a delivery module TRS, a delivery module SCPW which also serves as a temperature control cooling module, a buffer module which serves as both a delivery section and a buffer in which a plurality of wafers W can be placed, or an inspection module 10 are provided in a multi-stage. A heating module CPHP heating wafer W is inserted into shelf unit U2. Further, a delivery module TRS-A is used to deliver wafer W to and from delivery arm C of carrier block S1.

Further, in COT1 layer B3, COT2 layer B4, DEV1 layer B5, and DEV2 layer B6, a shelf unit U3 is provided in interface block S3. In shelf unit U3, a delivery module used to deliver wafer W between each of unit blocks B3 to B6 and interface block S3, a buffer module BU serving as both the delivery section and the buffer, and a delivery module SCPW including the temperature control function are provided in a multi-stage. For example, 8 wafers W may be placed in buffer module BU provided in shelf unit U1 and 80 wafers W may be placed in buffer module BU provided in shelf unit U3.

The BCT1 layer B1 and the BCT2 layer B2 include a liquid processing module BCT applying a chemical liquid for forming the anti-reflecting film at a lower layer of the resist as the liquid processing module, and are configured similar to COT1 layer B3 and COT2 layer B4 except that shelf unit U3 is not provided.

Herein, COT1 layer B3 will be described as an example of the module group provided in the unit block. In shelf unit U1, a plurality of delivery modules SCPW31 and SCPW32 or delivery modules TRS-A and BU31 which are used at the time of carrying the wafer in COT1 layer B3 are provided. Further, as liquid processing module group L, four liquid processing modules COT11 to COT14 are provided, and a plurality of heating modules CPHP are arranged in shelf unit U2. Further, in shelf unit U3, the plurality of delivery modules TRS31 and TRS32 and buffer module BU32 are provided.

In this example, each of liquid processing modules COT11 to COT14 includes a substrate holding section in which the substrate is substantially horizontally placed and a cup surrounding the substrate holding section. The substrate holding section will be referred to as a module. All modules provided in COT1 layer B3 correspond to a module group for forming the coating film on the substrate before exposure. Further, the modules are not used all together but the modules to be used are selected depending on a processing recipe.

In the present disclosure, since the plurality of unit blocks performing the same processing for wafer W are prepared, two layers of COT1 layer B3 and COT2 layer B4 each includes the same module group and are configured so that the modules constituting the module group or placement layouts of transportation arms A3 and A4 are the same as each other. Further, similarly, two layers of the BCT1 layer B1 and the BCT2 layer B2 and two layers of DEV1 layer B5 and DEV2 layer B6 each include the same module group and are configured so that the modules constituting the module groups or placement layouts of transportation arms A1, A2, A5, and A6 are the same as each other.

An interface arm E is provided in interface block S3. Interface arm E accesses each delivery module TRS of shelf unit U3, buffer module BU, and a carry-in stage or a carry-out stage of exposure device S4 and is configured to be elevatable, retractable, and rotatable around the vertical axis so as to deliver wafer W therebetween.

In addition, the resist pattern forming apparatus includes a control part 3 including a computer that performs management of the recipe of each module, management of a recipe of a transportation flow (transport path) of wafer W, processing in each module, driving control of delivery arm C, delivery arm D, transportation arms A1 to A6, and interface arm E. Control part 3 includes a program including a step (command) group, for example, software so that an operation of the entire resist pattern forming apparatus, that is, the processing in each module or transportation of wafer W for forming a predetermined resist pattern with respect to wafer W is performed. In addition, the program is read by control part 3, such that the operation of the entire resist pattern forming apparatus is controlled by the control part. Further, the program is stored while being embodied in storage media such as a flexible disk, a hard disk, a compact disk, a magnet optical disk, a memory disk, and the like.

Figure 4:
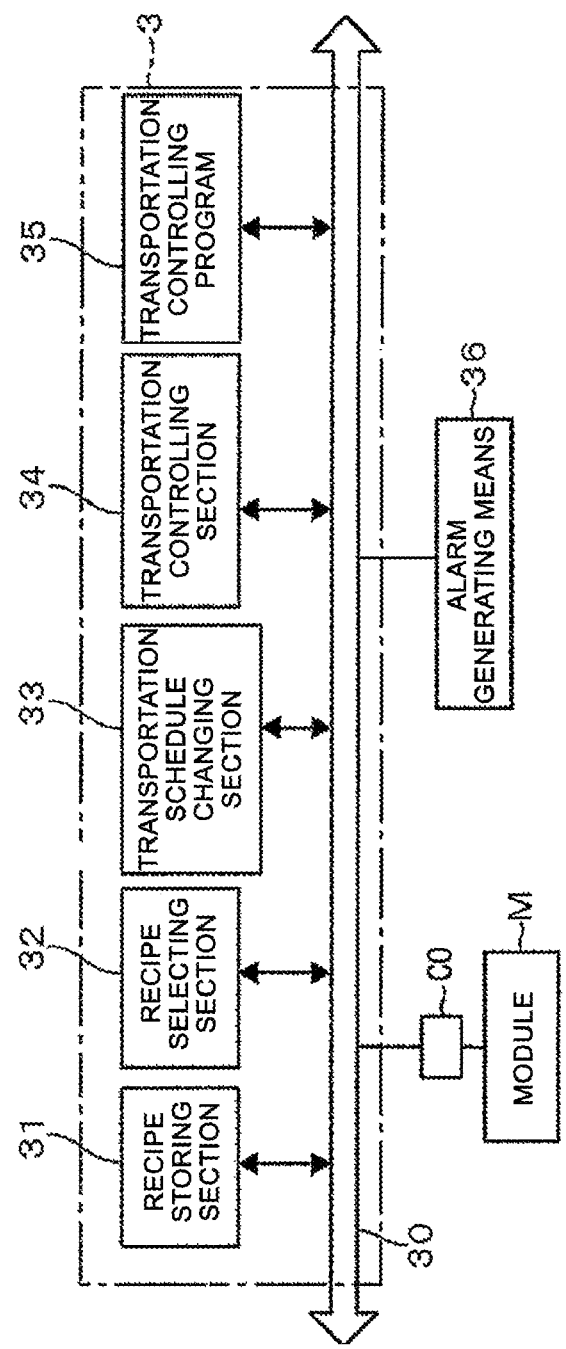
FIG. 4 is a configuration diagram illustrating an example of a control part of the resist pattern forming apparatus.

FIG. 4 shows a configuration of control part 3 and control part 3 is actually is constituted by a CPU (central module), a program, and a memory, but in the present disclosure, since transportation of wafer W is characterized when the module is disabled, some of components relating to the disabled module which are made into blocks will be described below. Reference numeral 30 in FIG. 4 represents a bus and a recipe storing section 31, a recipe selecting section 32, a transportation schedule changing section 33, a transportation control section 34, a transportation controlling program 35, and an alarm generating means 36 are connected to bus 30.

Further, each module M is connected to control part 3 through a controller CO and when the trouble occurs in each module M, an alarm signal is outputted to control part 3 from the module M through the controller CO. In addition, even when the wafer is not delivered to delivery arm D or transportation arms A1 to A6 at a predetermined timing, the alarm signal is outputted to control part 3. Moreover, the module M includes, for example, all modules inserted into shelf units U1 to U3 and the liquid processing module.

Recipe storing section 31 corresponds to a memory section and, for example, stores the transportation recipe in which a transport path of wafer W is recorded, a transportation schedule indicating at which timing and to which module all the wafers W in the lot will be transported based on the transportation recipe, or a plurality of recipes in which a processing condition applied to wafer W is recorded. Recipe selecting section 32 selects an appropriate recipe among the recipes stored in recipe storing section 31 and may select the module M to be used.

Transportation schedule changing unit 33 re-records the transportation schedule as described below when a module to which wafer W will be transported is disabled during wafer W transportation. Transportation controlling section 34 controls delivery arm C, delivery arm D, transportation arms A1 to A6, or interface arm E to transport wafer W recorded in transportation cycle data to a module corresponding to wafer W by referring to the transportation schedule so as to execute a transportation cycle. Transportation controlling program 35 is driven when the module to which wafer W will be transported is disabled while transporting wafer W. The program is executed based on the alarm signal generated, for example, when the trouble occurs in the module or confusion is created in transporting wafer W. Further, an operator selects the disabled module through a display screen of the computer to drive the program. The disabled module refers to a module into which wafer W cannot be carried when the trouble occurs in the module or due to maintenance. In addition, the case where the operator selects the disabled module includes performing the maintenance of the module or setting a module incapable of normally performing a process as a disabled module. Herein, the case where the process cannot be normally performed indicates a case where a difference from other multi-modules is generated. In this case, when the recipe is changed not to use the module, the recipe needs to be changed again if the module is restored to a normal state, and when there exist a plurality of recipes, since as many operations as the recipes are generated, the module may be set as a disabled module.

In addition, when a module is disabled and transportation control to be described below can be performed, the fact that the disabled module occur is displayed, for example, on the display screen of the computer. Then, delivery arm C, delivery arm D, transportation arms A1 to A6, and interface arm E are controlled, and the transportation control to be described below is performed by changing the transportation schedule. Meanwhile, even though the module is disabled, when the transportation control to be described below cannot be performed, an alarm is outputted by alarm generating means 36 and the apparatus stops. By alarm generating means 36, alarm generation such as lighting of a lamp, generation of alarm sound, or alarm display on the display screen is performed.

Herein, the time when the transportation control can be performed represents a case in which one or more modules of the plurality of modules constituting the multi-module can be used. In this case, the multi-module represents a plurality of modules having the same transportation sequences and performing the same processing for wafer W, that is, a plurality of modules in which the transportation recipe is set in the same step, among module groups in which wafers W are respectively placed and the transportation sequences are determined. Meanwhile, the time when the transportation control cannot be performed represents a case in which just one module is set in the same step of the transportation recipe or there is no usable module even though the plurality of modules are set in the same step of the transportation recipe.

Continuously, the transportation control of the present disclosure will be described in detail by using the case in which the plurality of unit blocks performing the same processing with respect to wafer W are COT1 layer B3 and COT2 layer B4 as an example. First, an example of the flow of wafer W in the resist pattern forming apparatus in a normal state will be described. Wafers W from carrier block S1 are transported to delivery module SCPW of shelf unit U1, for example, delivery modules SCPW11 and SCPW12, and SCPW21 and SCPW22 corresponding to BCT1 layer B1 and the BCT2 layer B2 in sequence by delivery arm C. In this case, since the BCT layers are constituted by two layers, wafers W in the lot are transported alternately to BCT1 layer B1 and BCT2 layer B2 in sequence from a leading wafer. For example, odd number-th wafers $W_{(2n-1)}$ are provided to the BCT1 layer B1 and even number-th wafers $W_{2n}$ are provided to the BCT2 layer B2.

In the BCT layer B1 (B2), wafer W is transported through a route in which liquid processing module BCT, heating module CPHP, and delivery modules TRS11 and TRS12 (TRS21 and TRS22) of shelf unit U1 are placed in sequence, by transportation arm A1 (A2), and an anti-reflecting film is formed on wafer W.

Thereafter, for example, wafer W of BCT layer B1 (B2) is transported to delivery modules SCPW31 and SCPW32 (SCPW41 and SCPW42) from delivery modules TRS11 and TRS12 (TRS21 and TRS22) by the delivery arm in shelf unit U1, and wafer W is transferred to COT layer B3 (B4) by transportation arm A3 (A4). In addition, in COT layer B3 (B4), wafer W is transported through a route in which liquid processing module COT, heating module CPHP, and delivery modules TRS31 and TRS32 (TRS41 and TRS42) of shelf unit U3 are disposed in sequence and a resist film is formed on the anti-reflecting film in wafer W.

In addition, wafer W of delivery modules TRS31 and TRS32 (TRS41 and TRS42) of shelf unit U3 is transported to the carry-in stage of exposure device S4 by interface arm E of interface block S3, and predetermined exposure processing is performed with respect to the transported wafer and thereafter, the exposed wafer is placed in delivery modules SCPW51 and SCPW52 (SCPW61 and SCPW62) of shelf unit U3 from the carry-out stage of exposure device S4 by interface arm E. In this example, for example, odd number-th wafers $W_{(2n-1)}$ are provided to delivery modules SCPW51 and SCPW52 and even number-th wafers $W_{2n}$ are provided to delivery modules SCPW61 and SCPW62

Continuously, wafer W of delivery modules SCPW51 and SCPW52 (SCPW61 and SCPW62) is received in DEV layer B5 (B6) by transportation arm A5 (A6) and in DEV layer B5 (B6), wafer W is transported through a route in which liquid processing module DEV, heating module CPHP, and delivery modules TRS51 and TRS52 (TRS61 and TRS62) of shelf unit U1 are placed in sequence. In addition, when wafer W is transported to inspection module 10, wafers W are transported to inspection module 10 according to the providing sequence from carrier 20 by delivery arm D and to be subjected to a predetermined inspection. Continuously, wafers W are transported to delivery module TRS-A according to the providing sequence from carrier 20 by delivery arm D. Thereafter, wafers W are returned to carrier 20 according to the providing sequence from carrier 20 by delivery arm C. Further, when wafer W is not transported to inspection module 10, wafers W are transported to delivery module TRS-A according to the providing sequence from carrier 20 by delivery arm D and thereafter, wafers W are returned to carrier 20 according to the providing sequence from carrier 20 by delivery arm C.

In this case, wafer W is transported by transportation arms A1 to A6 according to a transportation schedule to be described below, with respect to each module group in each of unit blocks B1 to B6. That is, in each of unit blocks B1 to B6, by each of transportation arms A1 to A6, in each module group, wafer W is extracted from one module, wafer W of the next module is received, and the previous wafer W is delivered to the next module, such that wafer W loaded in each module is shifted to a one-later module to execute one transportation cycle. After the one transportation cycle is executed, the next transportation cycle is executed and by sequentially executing the transportation cycles, wafers W are transported sequentially to a high-order module from a low-order module among the module groups to be subjected to predetermined processing.

Herein, in each of unit blocks B1 to B6, transportation arms A1 to A6 receive wafer W from delivery module SCPW forming the carry-in module and transport the received wafer W up to delivery module TRS which is a carry-out module at a downstream end of the transportation cycle on the above-mentioned transport path to thereby perform the transportation cycle in unit blocks B1 to B6, respectively.

In the above-mentioned transportation, as the transportation recipe in COT1 layer B3 (COT2 layer B4), 2 delivery modules SCPW31 and SCPW32 (SCPW41 and SCPW42), 2 liquid processing modules COT11 and COT12 (COT21 and COT22), 4 heating modules CPHP31 to CPHP34 (CPHP41 to CPHP44), and 2 delivery modules TRS31 and TRS32 (TRS41 and TRS42) are set in step 1, in step 2, in step 3, and in step 4, respectively. Accordingly, in COT1 layer B3 (COT2 layer B4), each of delivery modules SCPW31 and SCPW32 (SCPW41 and SCPW42), liquid processing modules COT11 and COT12 (COT21 and COT22), heating modules CPHP31 to CPH34 (CPHP41 to CPH44), and delivery modules TRS31 and TRS32 (TRS41 and TRS42) is set as the multi-module.

Figure 5:
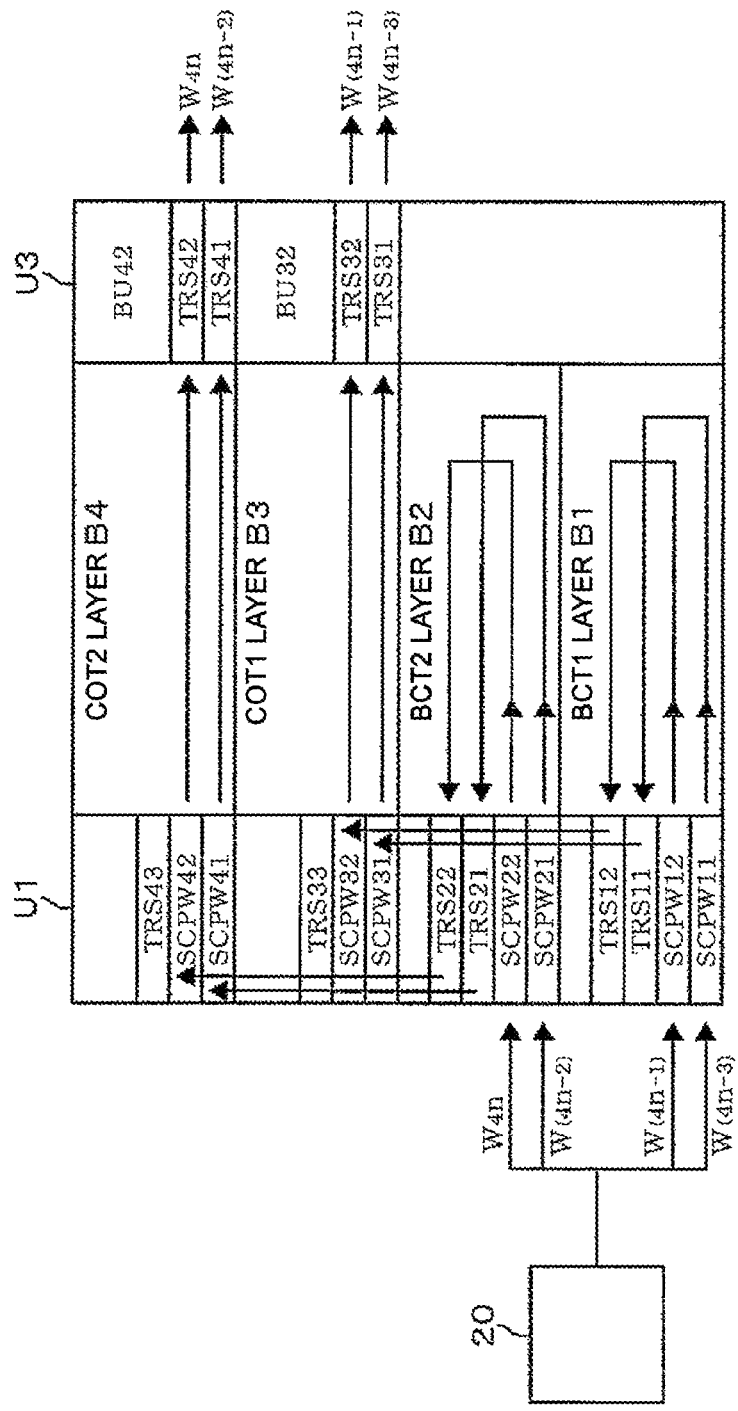
FIG. 5 is a longitudinal cross-sectional view illustrating a transportation path of a wafer in normal state.

Herein, the example of the transportation control in COT1 layer B3 and COT2 layer B4 in a normal state will be described in more detail with reference to FIG. 5. Wafers $W_{(4n-3)}$ provided at (4n−3)-th, that is, first, fifth, and the like of the lot from carrier 20 are transported to COT1 layer B3 through a system route of delivery module SCPW11, the BCT1 layer B1, delivery module TRS11, and delivery module SCPW31 which are placed in sequence, and the resist film is formed and thereafter, wafers W are transported to delivery module TRS31. Similarly, wafers $W_{(4n-2)}$ provided at (4n−2)-th, that is, second, sixth, and the like of the lot from carrier 20 are transported to COT2 layer B4 through a system path of delivery module SCPW211, the BCT2 layer B2, delivery module TRS21, and delivery module SCPW41 which are placed in sequence, and the resist film is formed and thereafter, wafers W are transported to delivery module TR431.

Wafers $W_{(4n-1)}$ provided at (4n−1)-th, that is, third, seventh, and the like of the lot from carrier 20 are transported to COT1 layer B3 through a system route of delivery module SCPW12, the BCT1 layer B1, delivery module TRS12, and delivery module SCPW32, and the resist film is formed and thereafter, wafers W are transported to delivery module TRS32. Further, wafers $W_{4n}$ provided at 4n-th, that is, fourth, eighth, and the like of the lot from carrier 20 are transported to COT2 layer B4 through a system route of delivery module SCPW22, the BCT2 layer B2, delivery module TRS22, and delivery module SCPW42 which are placed in sequence, and the resist film is formed and thereafter, wafers W are transported to delivery module TRS42. In this case, wafers W are transported to delivery modules TRS31, 32, 41, and 42 according to the providing sequence from carrier 20.

In addition, wafers W of delivery modules TRS31, TRS32, TRS41, and TRS42 are transported to the carry-in stage of exposure device S4 according to the providing sequence from carrier 20 by interface arm E. In this case, when the carry-in stage of exposure device S4 is available for wafers W, wafers W are transported directly to the carry-in stage and when the carry-in stage is not available for wafers W, wafers W are first transported to buffer modules BU32 and BU42. The case in which the carry-in stage of exposure device S4 is not available for wafers W represents a case in which exposure device S4 has a smaller throughput than processing block S2 and wafer W having a lower transportation order has been loaded in the carry-in stage of exposure device S4.

In regards to a simulation result of the transportation schedule at that time, COT1 layer B3 and COT2 layer B4 are shown in FIGS. 6 and 7, respectively. In the transportation schedule, a longitudinal axis represents the transportation cycle, and a transverse axis represents the module constituting the module group. Delivery modules SCPW31 and SCPW32 (SCPW41 and SCPW42) correspond to the carry-in modules and delivery modules TRS31 and TRS32 (TRS41 and TRS42) correspond to the carry-out modules. Further, reference numeral W1 represents a first wafer W of the lot and reference numeral W2 represents a second wafer W of the lot. A figure written at a right side of the transportation schedule represents a period from the time when the transportation cycle starts to the time when the transportation ends. Further, in a simulation result, a period from the time when first wafer W1 of the lot is placed in delivery module SCPW31 to the time when a last wafer W50 of the lot is placed in delivery module TRS41 is 783.4 sec.

In this case, delivery arm D transports wafer W carried out from BCT1 layer B1 or BCT2 layer B2 to carry-in modules SCPW31, SCPW32, SCPW41, and SCPW42 capable of transporting wafers W most rapidly and the transportation cycle starts when wafer W is delivered to liquid processing module COT which is a first module of the module group from carry-in modules SCPW31, SCPW32, SCPW41, and SCPW42. In addition, in a normal state, as shown in FIG. 5, wafer W is carried in to carry-in modules SCPW31, SCPW41, SCPW32, and SCPW42 from first wafer W in sequence according to the providing sequence from carrier 20.

Figure 8:
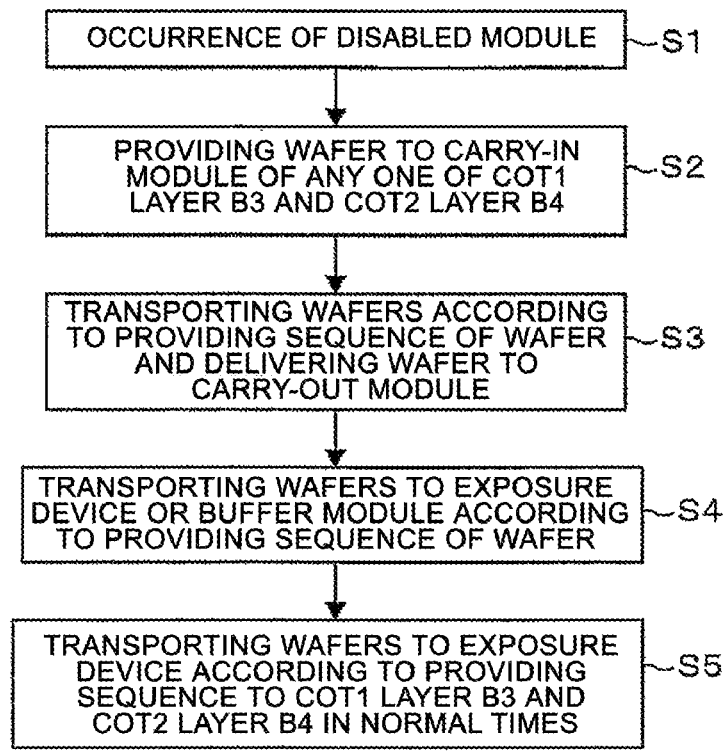
FIG. 8 is a flow diagram showing a transportation method of a wafer when a module is disabled.

Continuously, in COT1 layer B3, an example of transportation control when one heating module CPHP becomes the disabled module and one or more heating modules can be used will be described by using FIGS. 8 to 10. In this case, the transportation control shown in FIG. 8 is performed by transportation controlling program 35. That is, when the module is disabled (step S1), wafer W is provided to one of the carry-in modules (delivery modules SCPW31, SCPW32, SCPW41, and SCPW42) capable of placing wafers W most rapidly in COT1 layer B3 and COT2 layer B4 by delivery arm D forming a first delivery means (step S2). Herein, the expression "capable of placing wafer W most rapidly" represents that the previous wafer placed in delivery module SCPW has been received at earliest time by transportation arms A3 and A4.

In addition, in each of COT1 layer B3 and COT2 layer B4, wafers W are transported to the module group in sequence by transportation arms A3 and A4 to be delivered to the carry-out modules (delivery modules TRS31, TRS32, TRS41, and TRS42) according to the providing sequence of wafer W to the carry-in modules (delivery modules SCPW31, SCPW32, SCPW41, and SCPW42) (step S3).

Continuously, wafers W are extracted from the carry-out modules (delivery modules TRS31, TRS32, TRS41, and TRS42) by interface arm E which is a second delivery means and transported to exposure device S4 which is a rear module or buffer modules BU32 and BU42 which are substrate placing parts according to the providing sequence of wafer W to the carry-in modules (delivery modules SCPW31, SCPW32, SCPW41, and SCPW42) (step S4).

Thereafter, wafers W are transported to the carry-in stage of exposure device S4 from the carry-out module (delivery modules TRS31, TRS32, TRS41, and TRS42) or buffer modules BU 32 and BU42 by the second delivery means (interface arm E) according to the predetermined sequence in which wafer W is provided to the carry-in modules (delivery modules SCPW 31, SCPW32, SCPW41, and SCPW42) of COT1 layer B3 and COT2 layer B4 by the first delivery means (delivery arm D) in a normal state (step S5).

Figure 9:
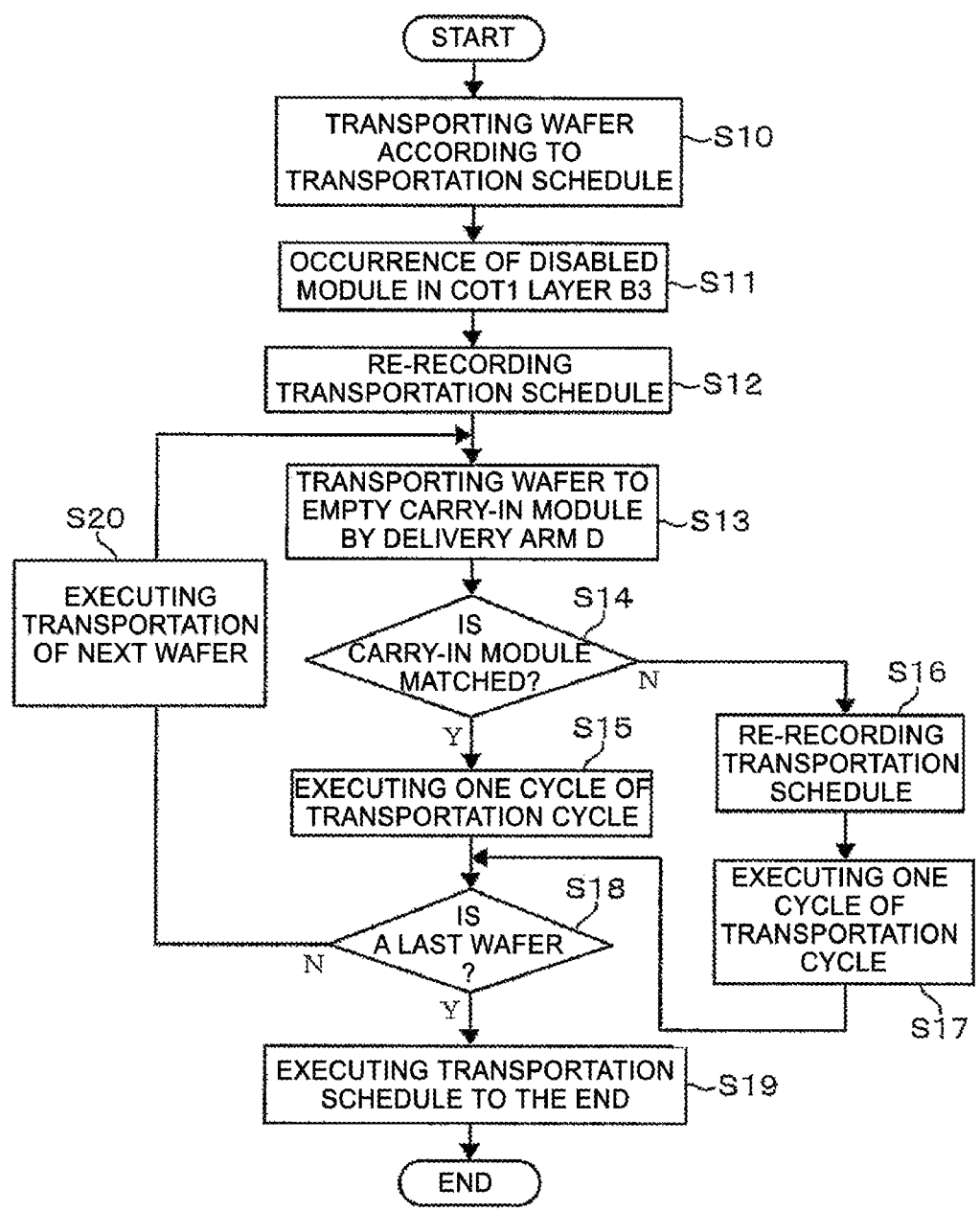
FIG. 9 is a flow chart showing a transportation method of a wafer when a module is disabled.
Figure 10:
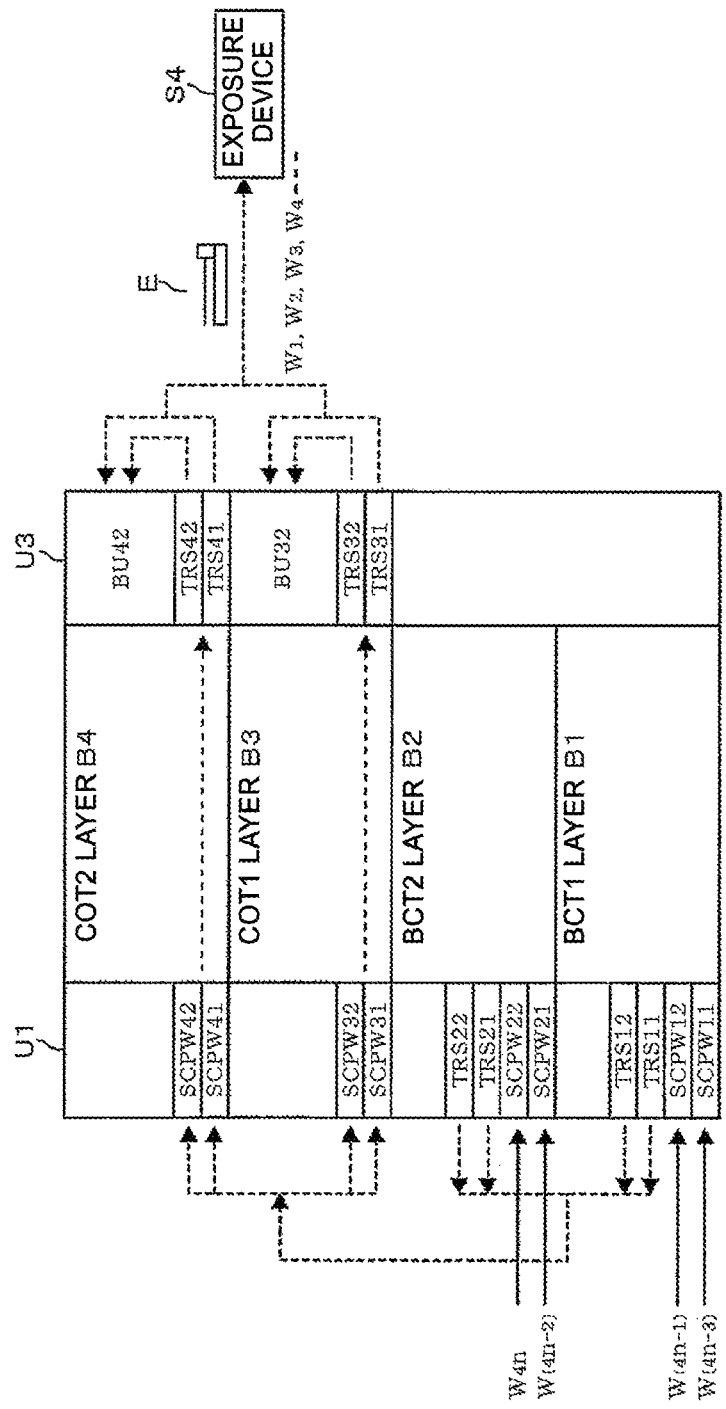
FIG. 10 is an explanatory view illustrating a transportation path of a wafer when a module is disabled in COT1 layer B3.

The actual transportation control is executed according to a flowchart shown in FIG. 9. Before the module is disabled, each wafer W is transported in COT1 layer B3 and COT2 layer B4 according to the transportation schedule in a normal state (step S10). When the trouble occurs in heating module CPHP31 of COT1 layer B3 to become the disabled module (step S11), the transportation schedule is re-recorded so as not to transport wafer W to heating module CPHP31 (step S12).

In addition, after the module is disabled, wafer W carried in to COT1 layer B3 and COT2 layer B4 is transported to the module capable of placing wafers W most rapidly among the carry-in modules (delivery modules SCPW31, SCPW32, SCPW41, and SCPW42 by delivery arm D (step S13).

When wafer W is placed in the carry-in module, it is determined whether the carry-in module is the same as the carry-in module written in the transportation schedule (step S14) and if so, wafer W is transported for one cycle in COT1 layer B3 or COT2 layer B4 according to the transportation schedule (step S15).

Meanwhile, when the carry-in module in which wafer W is placed is different from the carry-in module written in the transportation schedule, the transportation schedule is re-recorded so that wafer W carried in to the carry-in module becomes the same as wafer W placed in the carry-in module in the transportation cycle (step S16). In addition, according to the re-recorded transportation schedule, wafer W is transported for one cycle in COT1 layer B3 or COT2 layer B4.

Continuously, it is determined whether wafer W is the final wafer of the lot (step S18) and if so, wafer W is transported according to the transportation schedule (step S19). When wafer W is not the final wafer, wafer W provided from BCT1 layer B1 or BCT2 layer B2, which is next to the wafer is transported similarly from step S13 (step S20).

Therefore, in each of COT1 layer B3 and COT2 layer B4, according to the transportation schedule, wafers W are sequentially transported according to the providing sequence to the carry-in module to be delivered to the carry-out modules (delivery modules TRS31, TRS32, TRS41, and TRS42). In addition, wafers W of the carry-out modules (delivery modules TRS31, TRS32, TRS41, and TRS42) are extracted according to the providing sequence of wafer W to the carry-in module by interface arm E as described above.

Continuously, wafers W are transported to the carry-in stage of exposure device S4 according to the providing sequence from carrier 20 by interface arm E. That is, wafer W of the carry-out modules (delivery modules TRS31, TRS32, TRS41, and TRS42) is transported to the carry-in stage as it is when the providing sequence is a sequence in which wafer W is transported to the carry-in stage of exposure device S4 and when the providing sequence is not the sequence, wafer W is first transported to buffer modules BU32 and BU42. In addition, wafers W are transported to the carry-in stage of exposure device S4 directly from the carry-out modules (delivery modules TRS31, TRS32, TRS41, and TRS42) or through buffer modules BU32 and BU42 by interface arm E according to a predetermined providing sequence of wafer W to COT1 layer B3 and COT2 layer B4 by delivery arm D in a normal state.

In regards to a simulation result of the transportation schedule at that time, COT1 layer B3 and COT2 layer B4 are shown in FIGS. 11 and 12, respectively. In this transportation schedule, in COT2 layer B4, when a 41$^{st}$ wafer W41 of the lot is transported to delivery module SCPW41 in cycle 19, a 44-th wafer W44 of the lot is transported to delivery module SCPW41 in cycle 21, or a 49$^{th}$ wafer W49 of the lot is transported to delivery module SCPW42 in cycle 24, the transportation schedule is re-recorded. Further, according to the simulation result, a period from the time when first wafer W1 of the lot is placed in delivery module SCPW31 to the time when final wafer W50 of the lot is placed in delivery module TRS32 is 843.4 sec.

According to the exemplary embodiment, even though one of heating modules CPHP of COT1 layer B3 is disabled, when the other heating modules CPHP of COT1 layer B3 are usable, wafer W is carried in to the carry-in module capable of placing wafers W most rapidly among the carry-in modules (delivery modules SCPW31, SCPW32, SCPW41, and SCPW42) of COT1 layer B3 and COT2 layer B4.

As a result, even though the one of heating modules CPHP is disabled, the throughput can be prevented from being deteriorated as compared with the case where wafers W are alternately carried in to COT1 layer B3 and COT2 layer B4. Since wafers W are sequentially provided to unit blocks without the carry-in module, the usable heating module CPHP is prevented from being on standby for the transportation of wafer W and that operation efficiency of the usable heating module CPHP can be prevented from being deteriorated.

In this regard, when wafers W are alternately carried in to COT1 layer B3 and COT2 layer B4, in COT2 layer B4 where the module is not disabled, it is necessary to be on standby for carrying-in wafer W to COT1 layer B3 where the module is disabled or carrying-out wafer W from COT1 layer B3. In COT2 layer B4, wafer W is not transported to the transportable heating module CPHP and the operation rate is decreased, such that the throughput is deteriorated.

Herein, when heating module CPHP31 of COT1 layer B3 is disabled, with respect to the simulation result of the transportation schedule when wafers W are alternately provided to COT1 layer B3 and COT2 layer B4, COT1 layer B3 and COT2 layer B4 are shown in FIGS. 13 and 14, respectively. According to the simulation result, a period from the time when first wafer W1 is displaced in delivery module SCPW31 to the time when final wafer W50 is placed in delivery module TRS41 is 891.7, and the throughput is lower than the transportation control of the present disclosure.

In this case, in the present disclosure, since wafers W are not alternately transported to COT1 layer B3 and COT2 layer B4, wafers W may be provided from the carry-out module of one-side COT layer in a continuous sequence, but since wafers W are arranged first before being transported to exposure device S4 by using buffer modules BU32 and BU42 provided at the downstream side of carry-out module of COT1 layer B3 and COT2 layer B4, wafers W may be transported to exposure device S4 according to the providing sequence of wafer W from carrier 20.

Therefore, in each of COT1 layer B3 and COT2 layer B4, wafers W are transported according to the providing sequence to the carry-in modules (delivery modules SCPW31, SCPW32, SCPW41, and SCPW42), and thereafter, transported to the carry-out modules (delivery modules TRS31, TRS32, TRS41, and TRS42), and as a result, in COT1 layer B3 and COT2 layer B4, the providing sequence of wafer W may not be changed and complexity in transportation control is prevented.

Figure 15:
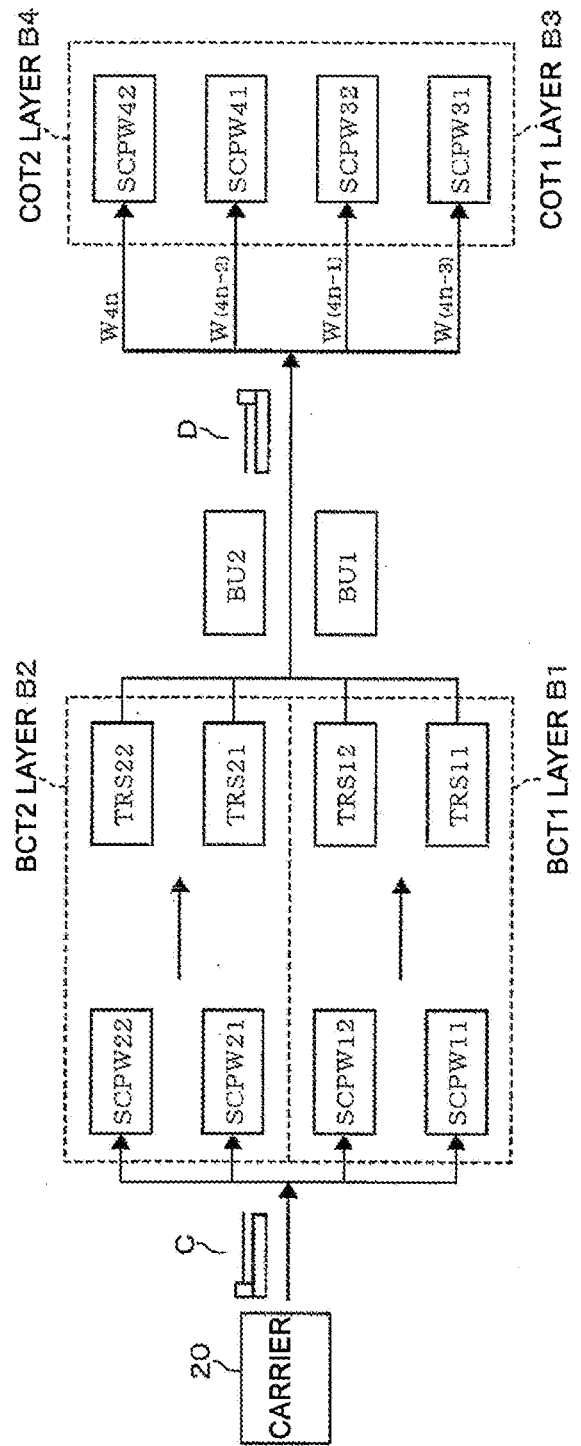
FIG. 15 is an explanatory view illustrating a transportation path of a wafer when a module is disabled in a BCT layer.

Continuously, a transportation example in another unit block will be described. FIG. 15 shows a transportation example in a case in which wafers W are first arranged according to the providing sequence from carrier 20 before being transported to COT1 layer B3 and COT2 layer B4 when one or more modules of the multi-module of any one of BCT1 layer B1 and BCT2 layer B2 are disabled and further, one or more modules are usable.

In this case, by a delivery arm C forming a first delivery means, wafer W is provided to the one of the carry-in modules (delivery modules SCPW11, SCPW12, SCPW21, and SCPW22) capable of placing wafers W most rapidly in BCT1 layer B1 and BCT2 layer B2. In addition, in each of BCT 1 layer B1 and BCT2 layer B2, wafers W are transported to the module group in sequence by transportation arms A1 and A2 to be delivered to the carry-out modules (delivery modules TRS11, TRS12, TRS21, and TRS22) according to the providing sequence of wafer W to the carry-in modules (delivery modules SCPW11, SCPW12, SCPW21, and SCPW22).

Continuously, wafers W are extracted from the carry-out modules (delivery modules TRS11, TRS12, TRS21, and TRS22) by a delivery arm D forming a second delivery means and transported to delivery modules SCPW31, SCPW32, SCPW41, and SCPW42 of COT1 layer B3 and COT2 layer B4 which are rear modules or buffer modules BU1 and BU 2 which are substrate placing parts according to the providing sequence of wafer W to the carry-in modules (delivery modules SCPW11, SCPW22, SCPW21, and SCPW22).

Continuously, according to a predetermined providing sequence of wafer W to delivery modules SCPW11, SCPW12, SCPW21, and SCPW22 of BCT layer B1 and BCT layer B2 by delivery arm C in a normal state, wafers W are transported to delivery modules SCPW31, SCPW32, SCPW41, and SCPW42 of COT1 layer B3 and COT2 layer B4 from the carry-out modules (delivery modules TRS11, TRS12, TRS21, and TRS22) or buffer modules BU1 and BU2 by delivery arm D.

That is, a (4n−3)-th wafer $W_{(4n-3)}$ of the lot is transported to delivery module SCPW31 of COT1 layer B3, a (4n−1)-th wafer $W_{(4n-1)}$ of the lot is transported to the carry-in module SCPW32 of COT1 layer B3, a (4n−2)-th wafer W the lot is transported to the carry-in module SCPW41 of COT2 layer B4, and a 4n-th wafer $W_{on}$ of the lot is transported to the carry-in module SCPW42 of COT2 layer B4.

Further, when one or more modules of the multi-module of any one of BCT1 layer B1 and BCT2 layer B2 are disabled and further, one or more multi-modules are usable, according to the providing sequence in which wafers W are provided to the carry-in modules (delivery modules SCPW11, SCPW12, SCPW21, and SCPW22) of BCT1 layer B1 and BCT2 layer B2 from delivery modules TRS11, TRS12, TRS21, and TRS22 of BCT1 layer B1 and BCT2 layer B2, wafers W are transported to delivery modules SCPW31, SCPW32, SCPW41, and SCPW42 of COT1 layer B3 and COT2 layer B4 by delivery arm D. In addition, when wafers W are transported to exposure device S4 from the carry-out modules (delivery modules TRS31, TRS32, TRS41, and TRS42) of COT1 layer B3 and COT2 layer B4, wafers W may be transported by interface arm E according to the providing sequence from carrier 20 by using buffer modules BU32 and BU42.

Figure 16:
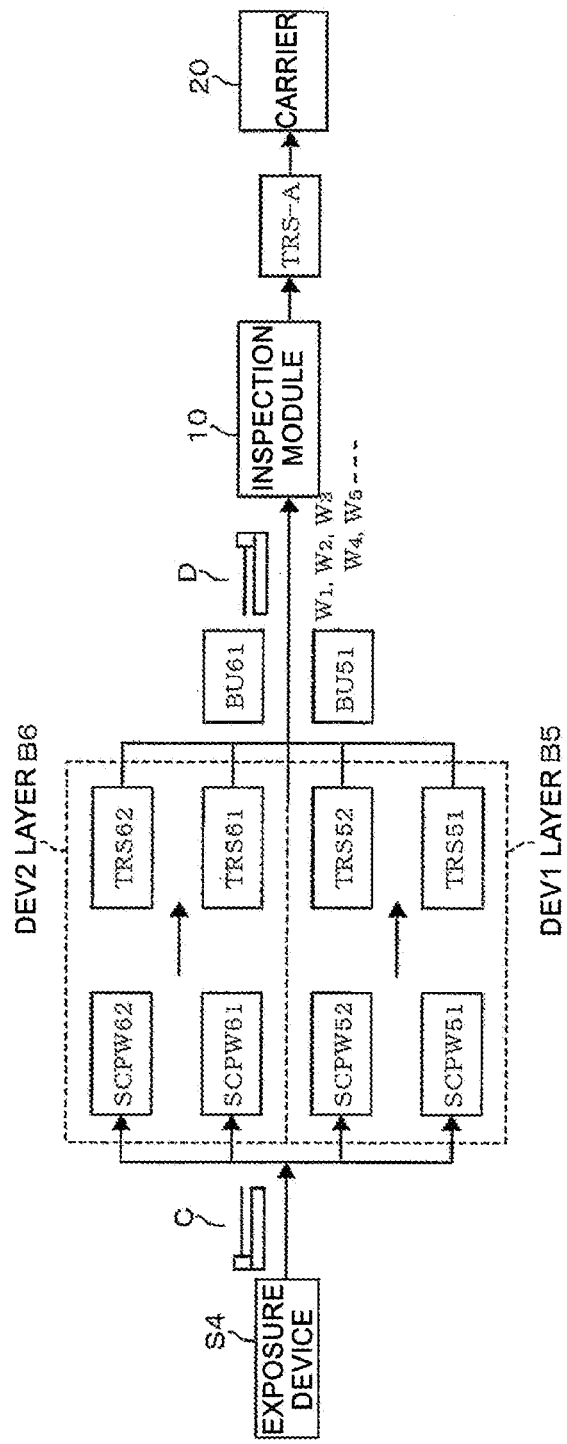
FIG. 16 is an explanatory view illustrating a transportation path of a wafer when a module is disabled in a DEV layer.

Further, FIG. 16 shows a transportation example in a case in which wafers W are first arranged according to the providing sequence from carrier 20 before being transported to inspection module 10 when one or more multi-modules of any one of DEV1 layer B5 and DEV2 layer B6 are disabled and further, one or more multi-modules are usable in a case in which wafer W developed in DEV1 layer B5 and DEV2 layer B6 is first transported to inspection module 10 and a predetermined inspection is performed and thereafter, returned to carrier 20.

In this case, by interface arm E forming the first delivery means, wafer W is provided to one of the carry-in modules (delivery modules SCPW51, SCPW52, SCPW61, and SCPW62) capable of placing wafers W most rapidly in DEV1 layer B5 and DEV2 layer B6. In addition, in each of DEV1 layer B5 and DEV2 layer B6, wafers W are transported to the module group in sequence by transportation arms A5 and A6 to be delivered to the carry-out modules (delivery modules TRS51, TRS52, TRS61, and TRS62) according to the providing sequence of wafer W to the carry-in modules (delivery modules SCPW51, SCPW52, SCPW61, and SCPW62).

Continuously, wafers W are extracted from the carry-out modules (delivery modules TRS51, TRS52, TRS61, and TRS62) by delivery arm D forming a second delivery means and transported to inspection module 10 which is a rear module or buffer modules BU51 and BU61 which are substrate placing parts according to the providing sequence of wafer W to the carry-in modules (delivery modules SCPW51, SCPW52, SCPW61, and SCPW62).

Therefore, according to a predetermined providing sequence of wafer W to the carry-in modules (delivery modules SCPW51, SCPW52, SCPW61, and SCPW62) of DEV1 layer B5 and DEV2 layer B6 by interface arm E in a normal state, wafers W are transported to inspection module 10 from the carry-out modules (delivery modules TRS51, TRS52, TRS61, and TRS62) or buffer modules BU51 and BU61 by delivery arm D. In inspection module 10, for example, a development defect is inspected.

Continuously, wafers W which are subjected to the predetermined inspection in inspection module 10 are transported to delivery module TRS-A by delivery arm D according to the providing sequence from carrier 20. In addition, wafers W are returned to carrier 20 according to the providing sequence from carrier 20 by delivery arm D.

Figure 17:
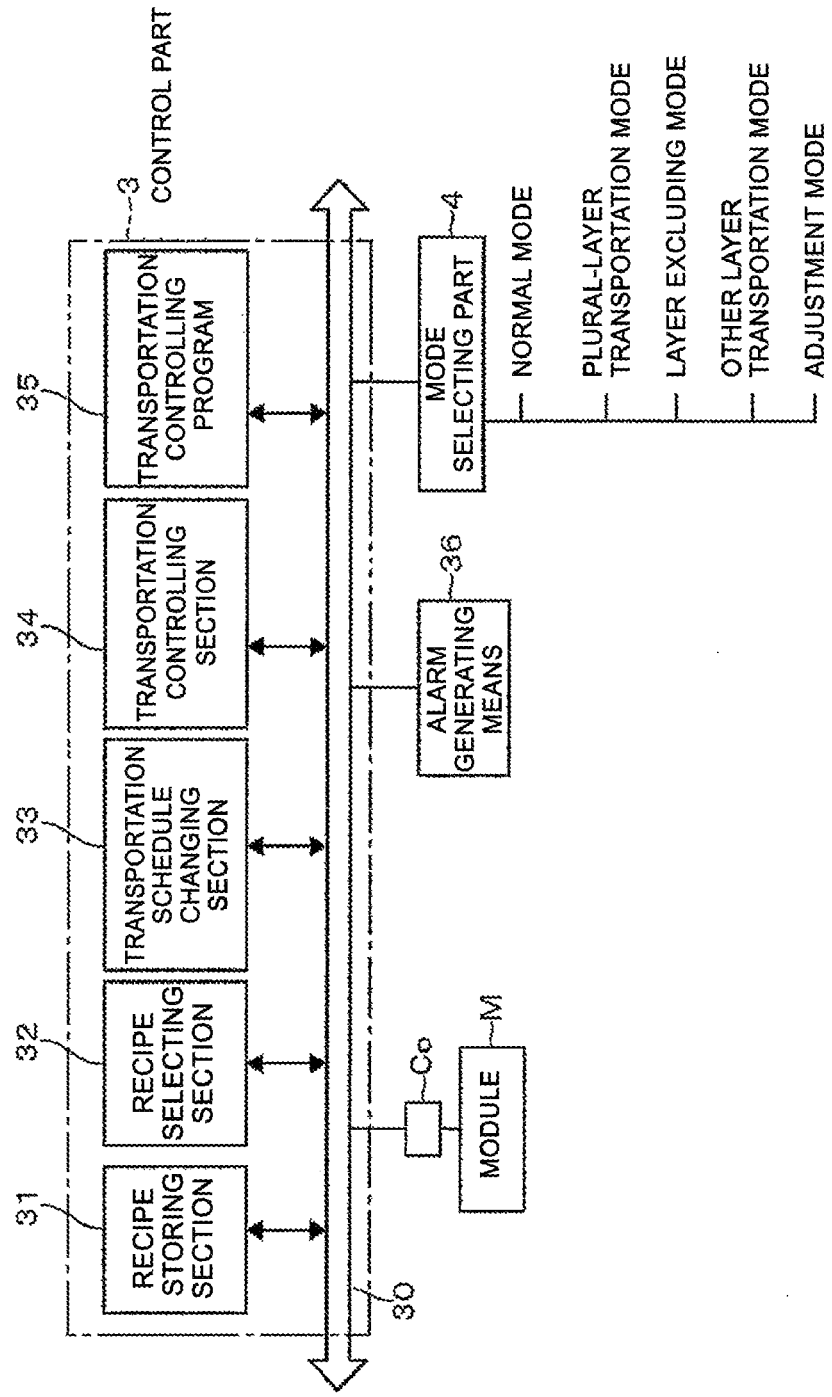
FIG. 17 is a configuration diagram illustrating a control part according to another exemplary embodiment of the present disclosure.
Figure 18:
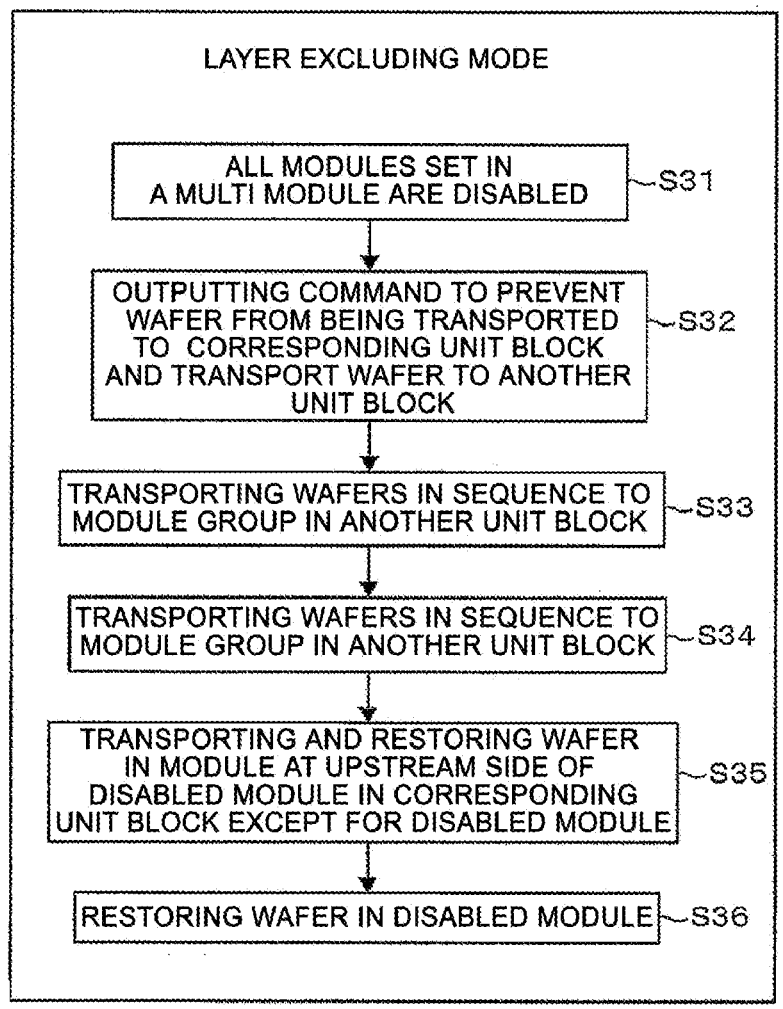
FIG. 18 is a flow diagram showing a transportation method when a wafer is transported in a layer-excluding mode.

Continuously, another exemplary embodiment of the present disclosure will be described. In the exemplary embodiment, when the module is disabled, the operator is able to select a transportation mode. Control part 3 of the exemplary embodiment includes a mode selecting part 4 as shown in FIG. 17 and mode selecting part 4 is configured to select a normal mode, a plural-layer transportation mode, a layer excluding mode, another layer transportation mode, and an adjustment mode, for example, from the display screen of the computer. The normal mode is a transportation mode in a normal state as described in FIG. 5 in the exemplary embodiment and the plural-layer transportation mode is a transportation mode when the module is disabled as described in FIGS. 10, 15, and 16 in the exemplary embodiment.

All of the plural-layer transportation mode, the layer excluding mode, the other layer transportation mode, and the adjustment mode are transportation mode selected when the module is disabled, but one of them is selected according to the state of the disabled module.

First, the layer excluding mode will be described with reference to FIG. 8. The layer excluding mode is selected when all the modules set in the multi-module are disabled (step S31) in the one unit block. In this case, a command is outputted, to prevent the wafer from being transported to the carry-in module of the one unit block and transport the wafer to the carry-in module of another designated unit block (step S32).

For example, a case in which all heating modules CPHP31 to CPHP34 of COT1 layer B3 are disabled will be described in detail as an example. A command is outputted to delivery arm D to transport wafer W to the carry-in modules (delivery modules SCPW41 and SCPW42) of the designated COT2 layer B4.

Continuously, in another designated unit block (COT2 layer B4), wafers W are transported to the module group in sequence to be delivered to the carry-out modules (delivery modules TRS41 and TRS42) according to the providing sequence of wafer W to the carry-in modules (delivery modules SCPW41 and SCPW42) (step S33).

Meanwhile, in the unit block (COT1 layer B3), transportation is performed as follows. First, wafers W in the module at the downstream side of the disabled module are transported to module group in sequence to be delivered to the carry-out modules (delivery modules TRS31 and TRS32) and continuously processed (step S34). That is, wafer W is transported to exposure device S4 by interface arm E.

In addition, wafers W in the module at the upstream side of the disabled module are sequentially transported to the rest module group other than the disabled module, and delivered to the carry-out modules (delivery modules TRS31 and TRS32) as an aborted wafer and recovered (step S35). The aborted wafer is a wafer in which processing is stopped on the way. Alternatively, wafer W is transported through the system route of delivery module TRS33 of shelf unit U1, delivery arm D, and delivery module TRS-A which are placed in sequence and may be recovered in the carrier by delivery arm C of carrier block S1. That is, the aborted wafer may be recovered from COT1 layer B3 through interface block S3 or DEV1 layer B5 or DEV2 layer B6 or may be recovered directly in carrier block S1 from COT1 layer B3.

In this example, since the disabled module is heating modules CPHP31 to CPHP34, the wafer is transported to not heating modules CPHP31 to 34 but carry-out modules TRS31 and TRS32 next to the liquid processing module. Thereafter, wafer W in the disabled module is recovered (step S36).

Figure 19:
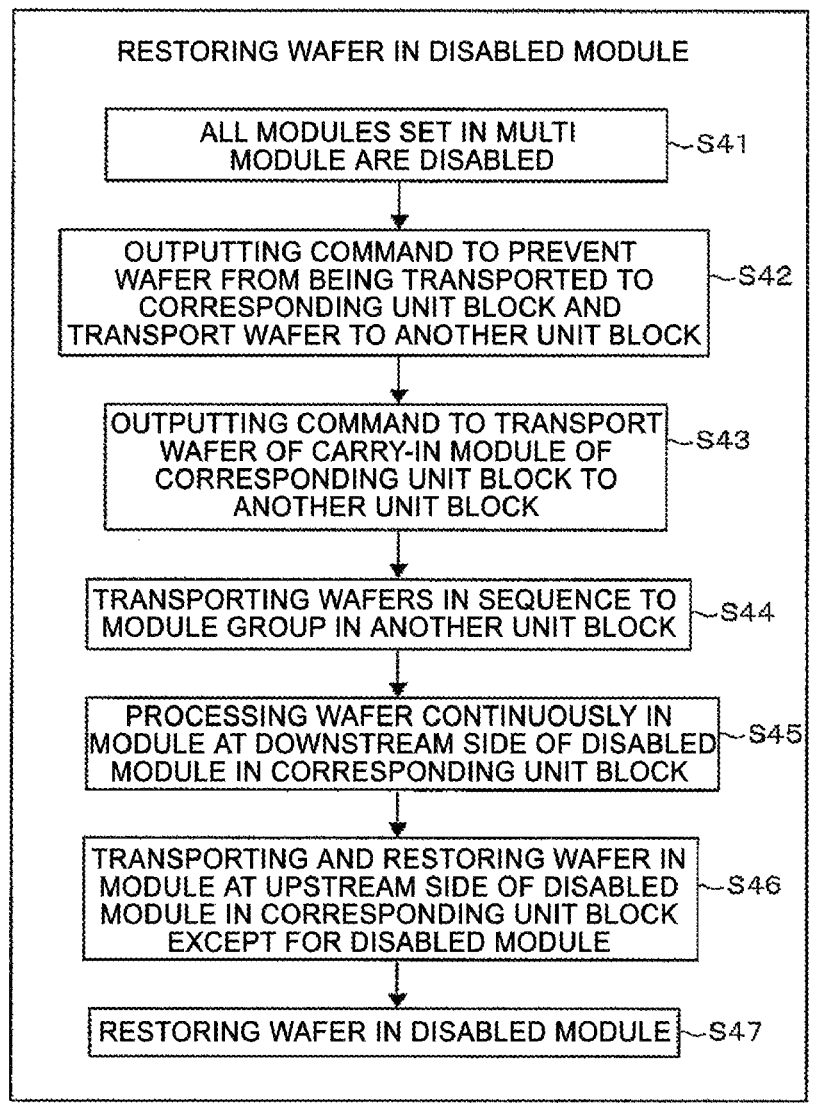
FIG. 19 is a flow diagram showing a transportation method when a wafer is transported in another layer-transportation mode.

Continuously, the other layer transportation mode will be described with reference to FIG. 19. The other layer transportation mode is selected when all the modules set in the multi-module are disabled (step S41) in one unit block. In addition, a command is outputted to transport wafer W of the carry-in modules (delivery modules SCPW31 and SCPW32) of the unit block (COT1 layer B3) where the module is disabled, to the carry-in modules (delivery modules SCPW41 and 42) of COT2 layer B4 which is another designated unit block by delivery arm D (step S43). Other processes (steps S42, and S44 to 47) are performed similarly as the processes (steps S32 to 36) of the above-mentioned layer excluding mode.

Figure 20:
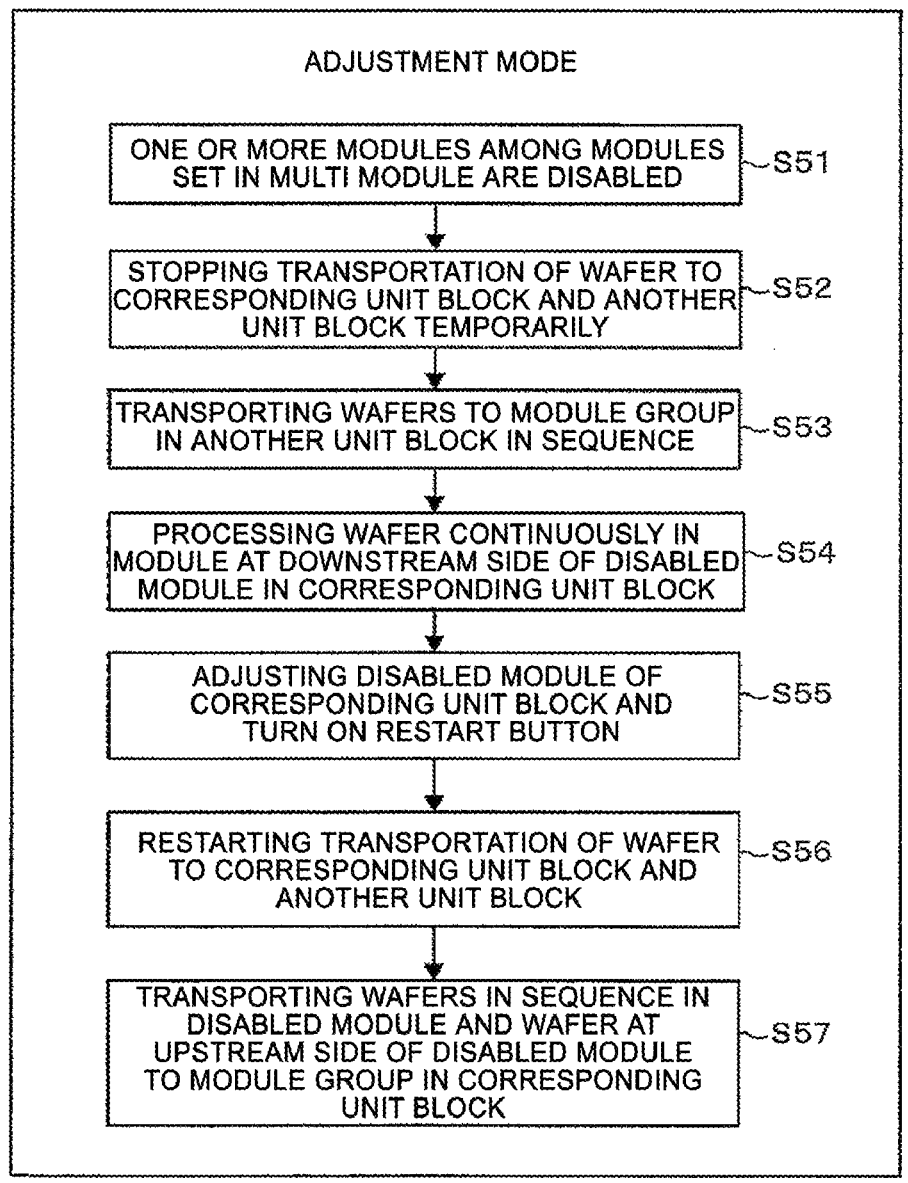
FIG. 20 is a flow diagram showing a transportation method when a wafer is transported in an adjustment mode.
Figure 21:
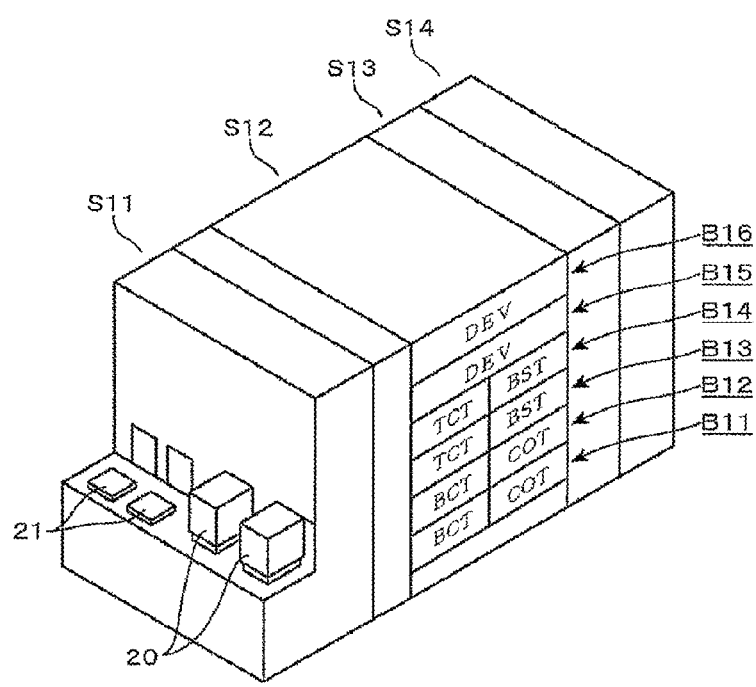
FIG. 21 is a perspective view illustrating another example of a resist pattern forming apparatus.

First, the adjustment mode will be described with reference to FIG. 20. The adjustment mode is selected when a trouble is removed by operator's adjustment when the flow rate of the chemical liquid is different in, for example, the liquid processing module. In this case, in, for example, one unit block (COT1 layer B3), when one module set in the multi module, for example, liquid processing module COT is disabled (step S51), transportation of wafer W to the carry-in modules (delivery modules SCPW31 and SCPW32) of COT1 layer B3 and transportation of wafer W to the carry-in modules (delivery modules SCPW41 and SCPW42) of COT2 layer B4 which is another unit block are first stopped (step S52).

In addition, wafers W in COT2 layer B4 are transported to the module group in sequence to be delivered to the carry-out modules (delivery modules TRS41 and TRS42) and thereafter, transported to exposure device S4 and continuously processed (step S53). Meanwhile, in COT1 layer B3, the wafers in the module at the downstream side of the disabled module are transported to the module group in sequence to be delivered to the carry-out modules (delivery modules TRS31 and TRS32) and thereafter, transported to exposure device S4 and continuously processed (step S54).

Further, the disabled module of COT1 layer B3 is adjusted by the operator and after the adjustment operation is terminated, for example, a restart button set on the display screen of the computer is turned on (step S55). In the adjustment operation, for example, when the flow rate of the resist liquid is erroneous, the flow rate is adjusted to a set flow rate.

Therefore, the carry-in of wafer W to the carry-in modules (delivery modules SCPW31, SCPW32, SCPW41, and SCPW42) of COT1 layer B3 and COT2 layer B4 is restarted (step S56). In addition, in COT1 layer B3, wafer W in the disabled module and wafer W at an upstream side of the disabled module are transported to the module group in sequence according to a carry-in sequence to the carry-in modules (delivery modules SCPW31 and SCPW32) to be delivered to the carry-out modules (delivery modules TRS31 and TRS32 and continuously processed (step S57). In COT2 layer B4, wafers W are transported to the module group in sequence according to a carry-in sequence to the carry-in modules (delivery modules SCPW41 and SCPW42) to be delivered to the carry-out modules (delivery modules TRS41 and TRS42) and continuously processed.

In the exemplary embodiment, since the operator selects the transportation mode, wafer W may be transported in an appropriate transportation mode according to a generation situation of the disabled module. In this case, when the trouble of the disabled module is minimal, the disabled module is restored to the usable state by selecting the adjustment mode, or a normal processing is performed in another unit block by selecting the other layer transportation mode to make stopping time of wafers W required to be recovered to be a minimum, deterioration of the throughput is suppressed, and a time required to recover the wafer can be reduced.

As described above, in the present disclosure, a common delivery means may be used as a first delivery means and a second delivery means. Further, substrates are extracted from the carry-out module to be transported to a substrate placing part by the transportation means according to the providing sequence of the substrate to the carry-in module, and the substrates may be transported to the rear module from the substrate placing part by the second delivery means according to a predetermined providing sequence of the substrate by the first delivery means in a normal state.

Further, the substrate placing part is set as the module at a downstream end of the module group instead of the carry-out module, the substrates are sequentially transported to the module group to be delivered to the substrate placing part, rather than to the carry-out module by the transportation means. The substrates are extracted from the substrate placing part by the second delivery means according to the providing sequence of the substrate to the carry-in module, and the substrate extracted from the substrate placing part by the second delivery means is transported to the rear module. Therefore, the substrates may be transported to the rear module from the substrate placing part according to the providing sequence of the substrate by the first delivery means in a normal state.

Further, the present disclosure may be applied to the configuration in which the substrate placing part is provided in the interface block or the case in which the common delivery means is used as the first delivery means and the second delivery means in addition to the resist pattern forming apparatus having the configurations of FIGS. 1 to 3. In the resist pattern forming apparatus shown in FIGS. 21 to 24, the substrate placing part is provided in the interface block.

As a brief explanation of the apparatus, processing block S12 is constituted by stacking six unit blocks B11 to B16. Unit block B11 and unit block B12 are configured to form the anti-reflecting film or the resist film, unit block B13 and unit block B14 are configured to form a liquid immersion exposure passivation film and clean the rear surface of wafer W, and unit block B15 and unit block B16 are configured to perform development process after liquid immersion exposure. Unit block B11 and unit block B12, unit block B13 and unit block B14, and unit block B15 and unit block B16 are configured similar to each other to perform the same processing with respect to each of wafers W.

The flow of wafer W in a normal state in this apparatus will be described. For example, five wafers W are collectively delivered to delivery module BU10 provided in shelf unit U11 of processing block S12 from carrier 20 by delivery arm C1 of carrier block S11. In addition, wafers W are alternately provided to unit block B11 and unit block B12 from delivery module BU10 to be transported to unit block B11, unit block B13, and unit block B15 in sequence or transported to unit block B12, unit block B14, and unit block B16 in sequence. For example, odd number-th wafers $W_{(2n-1)}$ of a lot are provided to unit block B11 and even number-th wafers $W_{2n}$ are provided to unit block B12.

When wafers W are transported to unit block B11, wafers W are transported to a hydrophobization processing module ADH11, a delivery module SCPW111, anti-reflecting film forming module BCT, a heating module of shelf unit U12, delivery module SCPW112 of shelf unit U11, a resist film forming module COT, a heating module of shelf unit U12, and delivery module SCPW113 of shelf unit U11 in sequence from delivery module BU10 by delivery arm D1, and an anti-reflecting film and a resist film are formed in sequence.

In addition, wafers W are transported to a delivery module SCPW131 of shelf unit U11 and transported to a passivation film forming module, heating module of shelf unit U12, delivery module SCPW132 of shelf unit U11, a rear surface cleaning module, and buffer module BUF of shelf unit U14 in sequence, by delivery arm D1, and a passivation film is formed and a rear surface is additionally cleaned.

Shelf unit U14 is provided in interface block S13 and modules are stacked on shelf unit U14 in a multi-stage. For example, each module of shelf unit U14 may be accessible to transportation arms A13 to A16 of unit blocks B13 to B16 and interface arms E1 and E2. In buffer module BUF, a plurality of wafers W are placed in a multi-stage and in this example, buffer module BUF is provided in a region accessible to transportation arms A13 to A16 and interface arms E1 and E2, respectively.

Transportation of the wafers will be described below. Wafers W of buffer module BUF are transported to interface arm E2, delivery modules SCPW71 to SCPW73 of shelf unit U14, an interface arm E3, and an exposure device S14 in sequence, and is subjected to liquid immersion exposure processing. After exposure processing, wafers W are transported to interface arm E3, a delivery module TRS7, interface arm E2, buffer module BUF, interface arm E1, post-exposure cleaning modules PIR1 to PIR4, interface arm E1, and buffer module BUF in sequence, that is, in order of a height position of unit block B15.

Continuously, wafers W are transported to the heating module of shelf unit U12, delivery module SCPW151 of shelf unit U11, development module DEV, the heating module of shelf unit U12, delivery module SCPW152 of shelf unit U11, delivery arm D1, buffer module BU15, and inspection module 10 in sequence by transportation arm A15 to be subjected to a predetermined inspection. After the inspection, wafers W are transported to inspection module 10, delivery arm D1, and delivery module SCPW10 in sequence and returned to carrier 20 by delivery arm C1. Wafers W which are set not to be inspected in inspection module 10 are sequentially processed in the development module DEV and the heating module and thereafter, transported to delivery module SCPW152, delivery arm D1, delivery module SCPW10 of shelf unit U11, delivery arm C1, and carrier 20 in sequence.

Continuously, in, for example, unit blocks B11 and B12, when a module is disabled, a case in which wafer W is transported in the plural-layer transportation mode will be described. In this case, the carry-in module becomes hydrophobization processing modules ADH11 and 21, wafer W is transported to any one of the hydrophobization processing modules ADH11 and 21 capable of placing the wafers most rapidly by delivery arm D1 (first delivery means), and in each of unit blocks B11 and B12, wafers W are transported to the module group and transported to delivery modules SCPW113 and SCPW123 which are the carry-out modules according to a carry-in sequence to the carry-in modules (hydrophobization processing modules ADH11 and ADH21).

Thereafter, wafer W is transported to delivery modules BU110 and BU120 forming the substrate placing part or transported directly to delivery module SCPW131 of unit block B13 and delivery module SCPW141 of unit block B14, by delivery arm D1 (second delivery means). Delivery modules SCPW131 and SCPW141 correspond to the rear modules. Therefore, wafers W are alternately transported to delivery modules SCPW131 and SCPW141 by delivery arm D1 according to the providing sequence from carrier 20. That is, odd number-th wafers $W_{(2n-1)}$ of a lot are provided to unit block B13 and even number-th wafers $W_{2n}$ of a lot are provided to unit block B14. In this case, both the first delivery means and the second delivery means become delivery arm D1.

Next, in for example, unit blocks B13 and B14, when the module is disabled, the case in which wafer W is transported in the plural-layer transportation mode will be described. In this case, the carry-in module becomes delivery modules SCPW131 and SCPW141, wafer W is transported to delivery modules SCPW 131 and SCPW141 capable of placing wafers W most rapidly by delivery arm D1 (first delivery means), and in each of unit blocks B13 and B14, wafers W are transported to the module group and transported to buffer module BUF which is the carry-out module according to a carry-in sequence to the carry-in modules (delivery modules SCPW131 and SCPW141). In this example, the carry-out module is the substrate placing part.

Thereafter, wafers W are provided to delivery modules SCPW71 to SCPW73 forming the rear modules according to the providing sequence from carrier 20 by interface arm E2 (second delivery means) and transported to exposure device S14 by interface arm E3 according to the providing sequence from carrier 20.

Further, in, for example, unit blocks B15 and B16, when the module is disabled, the case in which wafer W is transported in the plural-layer transportation mode will be described. In this case, the first delivery means is interface arm E1 and the carry-in module is buffer module BUF. In addition, wafer W is transported to any one of a height position of unit block B15 and a height position of unit block B16 of buffer module BUF, that is, a region capable of placing wafers W most rapidly. In each of unit blocks B15 and B16, wafers W are transported to the module group according to the carry-in sequence to the carry-in modules (regions corresponding to unit blocks B15 and B16 of buffer module BUF) and transported to delivery modules SCPW152 and SCPW162 which are the carry-out modules.

Thereafter, when wafer W is transported to inspection module 10, wafers W are transported to buffer modules BU15 and BU16 forming the rear modules by delivery arm D1 (second delivery means) according to the providing sequence from carrier 20 and continuously, transported to inspection module 10 by delivery arm D1 according to the providing sequence from carrier 20.

As described above, the present disclosure may well be applied to a coating and development device as well processing a substrate such as a glass substrate (LCD substrate) for a liquid crystal display in addition to a semiconductor wafer.

Figure 25:
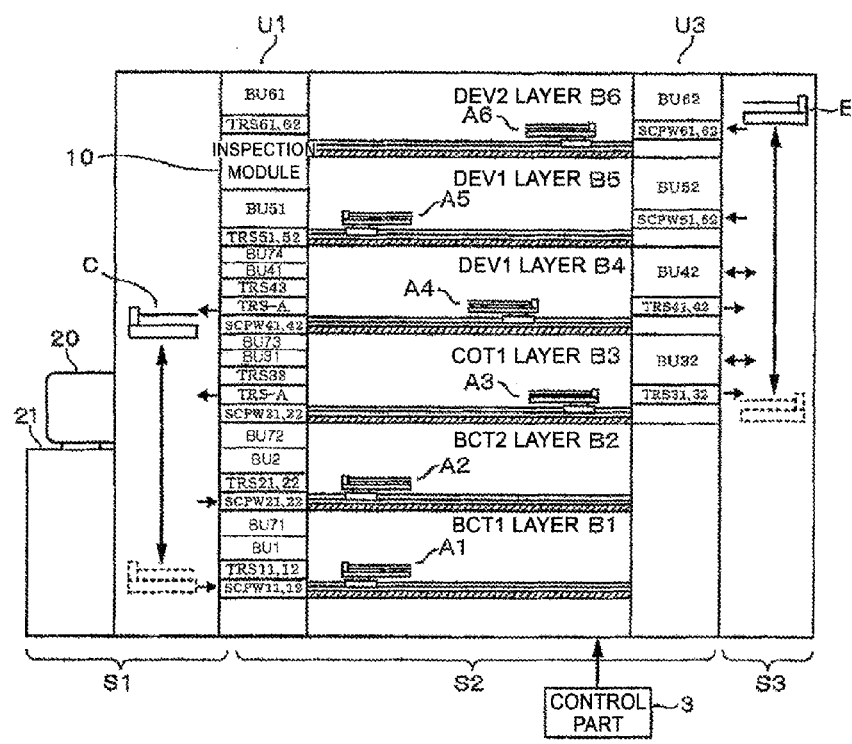
FIG. 25 is a vertical cross-sectional view illustrating another resist pattern forming apparatus.

Continuously, in FIGS. 1 to 3 described above, the transportation example of the aborted wafer in the coating and development device is described in detail, but herein, for example, as shown in FIG. 25, carry-in buffer modules BU71, BU72, BU73, and BU74 of the aborted wafer are provided at heights of unit blocks B1, B2, B3, and B4 of shelf unit U1, respectively.

Herein, configurations of liquid processing modules BCT and COT will be described in detail. Liquid processing module (resist film forming module) COT includes the substrate holding section, and the substrate holding section adsorbs and holds the center of the rear surface of wafer W and rotates around the central axis of wafer W. Further, in the resist film forming module COT, a resist discharge nozzle (coating film forming mechanism) discharging resist to wafer W and a thinner discharging nozzle (coating film removing mechanism) discharging thinner are provided. When a resist film is formed, spin coating is performed by discharging the thinner to the center of wafer W while rotating the substrate holding section, wettability of the surface of wafer W is improved, and thereafter, the resist is discharged to the center of wafer W to form the resist film by spin coating.

Further, in the resist film forming module COT, the thinner is discharged to the center of wafer W and spread throughout wafer W by centrifugal force while rotating the substrate holding section after forming the resist film to remove the corresponding resist film from wafer W. Further, the resist film forming module COT serves to detect pressure in a pipe connected to the nozzle or a discharge amount of the resist or whether or not a liquid is dripped from a tip of the nozzle when discharging the resist and when they are erroneous, an alarm signal is outputted to control part 3.

Liquid processing module (anti-reflecting film forming module) BCT is configured similarly as the resist film forming module COT except that the nozzle discharging a liquid for forming the anti-reflecting film is provided instead of the resist discharging nozzle, and may form the anti-reflecting film by the chemical liquid and remove the anti-reflecting film by the thinner.

Figure 26:
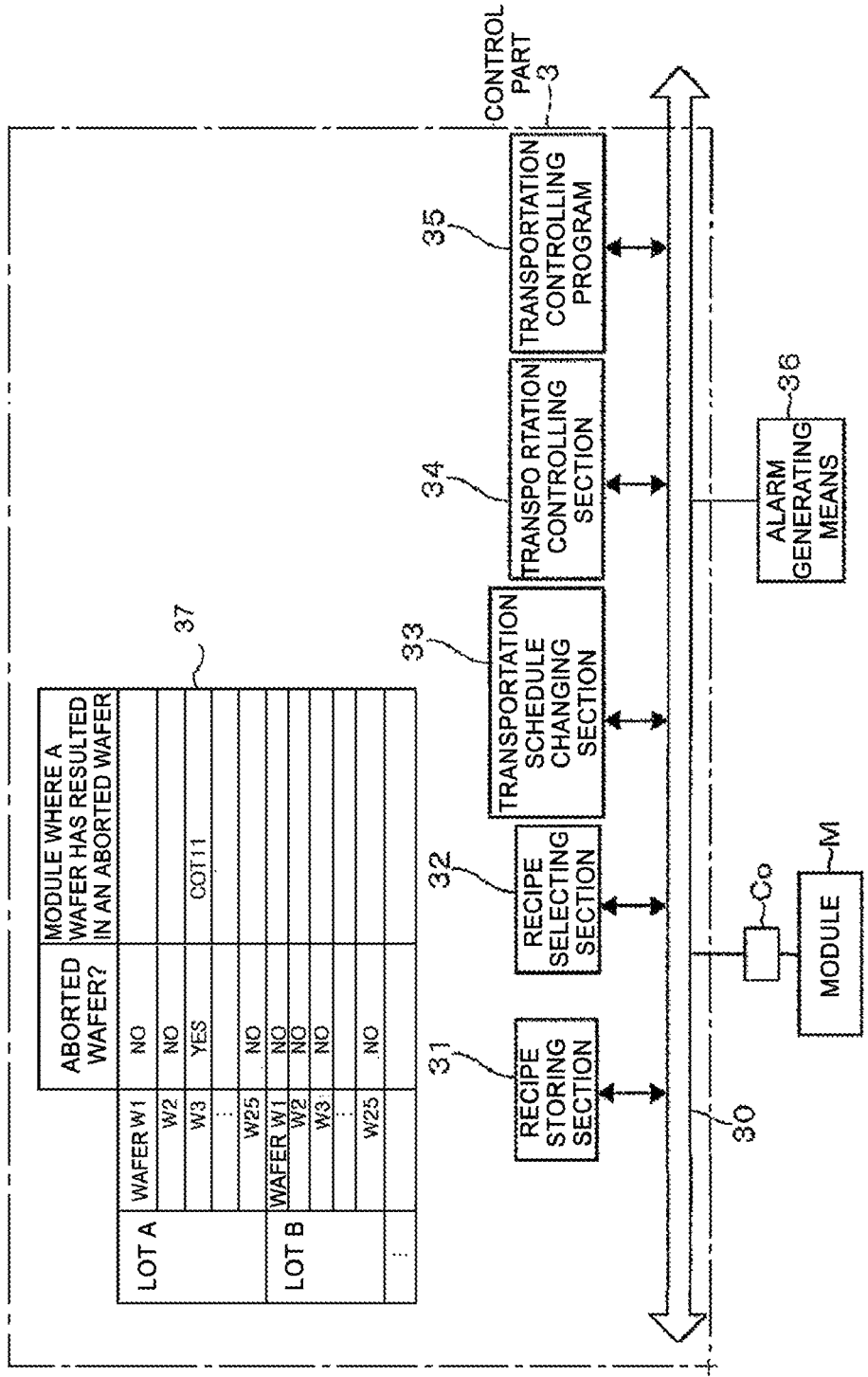
FIG. 26 is a configuration diagram of another control part.

Further, the configuration of control part 3 will be additionally described. Control part 3 includes a storing section 37 as shown in FIG. 26. Storing section 37 stores IDs (indicated by numbers of W1 to W25 for each lot as shown in FIG. 26) for specifying wafers W of each lot and the indication of whether wafer W is the aborted wafer, in such a manner that the IDs and the indication are associated with each other and additionally stores the indications about which module the stored wafer W is determined as the aborted wafer with respect to the aborted wafer and the wafer W. Based on data stored in storing section 37, an operation of each transportation means is controlled by transportation controlling section 34 so as to transport the aborted wafer between the modules as described above.

Continuously, transportation of the aborted wafer when the anti-reflecting film forming module BCT or the resist film forming module COT are disabled and the normal transportation mode is converted into the plural-layer transportation mode will be described. In the case of transportation of the aborted wafer in the layer excluding mode, the aborted wafer may be transported as described below except for the above-mentioned example. Herein, the disabled module can be operated with respect to the thinner supplying nozzle and the substrate holding section.

(Case A: a Case in which Wafer W is Aborted in the Anti-Reflecting Film Forming Module BCT)

Herein, the disabled module is the anti-reflecting film forming module BCT of BCT1 layer B1. Anti-reflecting film forming module BCT which becomes the disabled module by the alarm signal transmitted from the module is stored in storing section 37 and wafer W which is processed in the disabled module is stored in storing section 37 as the aborted wafer based on a transportation schedule which is being executed. In addition, as already described in FIG. 15, wafers W other than the aborted wafer are processed in the usable anti-reflecting film module BCT of BCT1 layer B1 to be transported to the downstream side.

In BCT which becomes the disabled module, the aborted wafer is rotated by the substrate holding section and the thinner is supplied to the aborted wafer, and the anti-reflecting film is removed from the surface of the aborted wafer. Thereafter, the aborted wafer is transported to buffer module BU71 by transportation arm A1 to be on standby in the module.

In addition, in the lot to which the aborted wafer belongs, a last wafer which is carried in to BCT1 layer B1 is carried in to delivery modules SCPW11 and SCPW12 and thereafter, following the final wafer W, the aborted wafer is transported to delivery modules SCPW11 and SCPW12 by delivery arm D to control temperature. Thereafter, the aborted wafer is transported to the usable anti-reflecting film forming module BCT of BCT1 layer B1 by transportation arm A1, and the anti-reflecting film is formed in corresponding anti-reflecting film forming module BCT. Further, when the aborted wafer is carried in to delivery modules SCPW11 and SCPW12, wafer W of the subsequent lot is not carried in to delivery modules SCPW11 and 12. The aborted wafers with the anti-reflecting film are transported to the module in sequence similarly as a normal wafer W, and the resist film is formed, exposed, and developed in sequence, such that the corresponding wafers are recovered to the provided carrier 20.

Even when the disabled module is the anti-reflecting film forming module BCT of BCT2 layer B2, except that a module that makes wafer W to be on standby is a BU72 and the aborted wafer is transported to the usable ant-reflecting film forming module of BCT2 layer B2 from the BU72 through delivery modules SCPW21 and SCPW22 to be processed, the same transportation as the case in which the disabled module is anti-reflecting film forming module BCT of the BCT1 layer B1 is performed.

(Case B: A Case in which the Wafer is Aborted in the Resist Film Forming Module COT)

This case is substantially the same as the case in which the wafer is aborted from the anti-reflecting film forming module, and difference will be primarily described. Herein, the disabled module is the resist film forming module COT of COT1 layer B3. Based on a signal from the module and a transportation schedule which is being executed, wafer W which is processed in the disabled module is stored in storing section 37 as the aborted wafer. In addition, wafer W other than the aborted wafer is processed by the usable resist film forming module COT of COT1 layer B3 to be transported to the downstream side.

In the COT which becomes the disabled module, the resist film is removed as described above. In this case, since a lower anti-reflecting film of the resist film is heated in the heating module, the lower anti-reflecting film is not removed but remains on wafer W because solubility of the lower anti-reflecting film to the thinner becomes low. In addition, the aborted wafer is transported to buffer module BU73 by transportation arm A3 to be on standby. In the lot to which the aborted wafer belongs, a final wafer which is carried in to COT1 layer B3 is carried in to delivery modules SCPW31 and SCPW32, and thereafter, the aborted wafer is transported to delivery modules SCPW31 and SCPW32 before the next lot is carried in to the modules SCPW31 and SCPW32. In addition, by transportation arm A3, wafer W is transported to the usable resist film forming module COT of COT1 layer B3 to be subjected to the forming processing of the resist film. Thereafter, the aborted wafers are transported to the module in the same sequence as the normal wafer W, and are subjected to the exposure and development processes, such that the corresponding wafers are returned to the provided carrier 20. Even when the disabled module is the resist film forming module COT of COT2 layer B4, except that wafer W is on standby in buffer module BU74 and the usable resist film forming module COT is transported and processed in COT2 layer B4, the same transportation is performed.

As described above, by removing the anti-reflecting film or the resist film in the disabled module, the aborted wafer does not need to be transported to the device removing the films, and therefore an effort required for the transportation can be removed and the throughput can be prevented from being deteriorated. Further, since it is possible to skip an effort to transport wafer W to the coating and development device from the device performing the removing processing in order to form the anti-reflecting film and the resist film again after removing the films, the throughput can be improved.

After removing the films, a standby place of the aborted wafer is not limited to the module of shelf unit U1. For example, the aborted wafer may be on standby in the disabled module and after removing the films, the aborted wafer is recovered to carrier 20 through buffer module BU or delivery module TRS and delivery arm C provided in each layer of shelf unit U1 first and is on standby in carrier 20. In addition, the aborted wafer is provided from carrier 20 before the lot is provided from carrier 20, such that the film may be formed.

As described above, when wafer W is provided from carrier 20, wafer W which becomes the aborted wafer in the anti-reflecting film forming module BCT is transported to the usable anti-reflecting film forming module of BCT layer B1 or B2 through any one of delivery arm C and delivery modules SCPW11 to SCPW22. Wafer W Which becomes the aborted wafer in the resist film forming module COT is transported to the usable resist film forming module COT of COT layer B3 or B4 through any one of delivery arm C and delivery modules SCPW31 to SCPW42.

Further, in the above-mentioned example, the film is formed in the usable module in the layer where the module is disabled, but the aborted wafer is transported to another layer by using transportation arm A, and delivery module D and the film may be again formed by using the usable module of the layer.

Specifically, for example, in the case A, the wafer is aborted in BCT1 layer B1 can be transported to delivery modules SCPW21 and SCPW22 from buffer module BU71 by delivery arm D to be transported to the anti-reflecting film forming module BCT by transportation arm A2. Further, the aborted wafer generated in BCT2 layer B2 can be transported to delivery modules SCPW21 and 22 from buffer module BU72 by delivery arm D to be transported to anti-reflecting film forming module BCT by transportation arm A2. Even in a case B, the aborted wafer can be transported to buffer modules BU73 and 74 of the layer where the corresponding wafer is aborted by transportation arms A3 and A4, and transported to a delivery module SCPW of another layer in delivery arm D to be transported to the resist film forming module COT by the transportation arm of the layer. Further, the aborted wafer may be transported to delivery module SCPW of the layer where the corresponding wafer is aborted, from the disabled module by transportation arm A and transported to the usable liquid processing module in the layer by transportation arm A.

That is, until the film is again formed in the aborted wafer, the corresponding aborted wafer may be transported by only transportation arm A regardless of delivery arm D.

Further, in the above-mentioned example, the film is again formed after removing the film of the aborted wafer, but the aborted wafer may be returned to carrier 20 without forming the film again. Even in this case, since the aborted wafer does not need to be transported to the device removing the film, an effort required for the transportation can be removed and the throughput can be prevented from being deteriorated.

The transportation example of the aborted wafer when the plural-layer transportation mode is executed is described, but the removing processing of the film or the resulting re-forming of the film may be performed with respect to the aborted wafer generated when the layer excluding mode, the other layer transportation mode, or the adjustment mode is executed. When the removing processing of the film is performed, the aborted wafer may be returned to carrier 20 after removing the film as described above, and a user may recover the aborted wafer while the aborted wafer stays in the disabled module.

Figure 22:
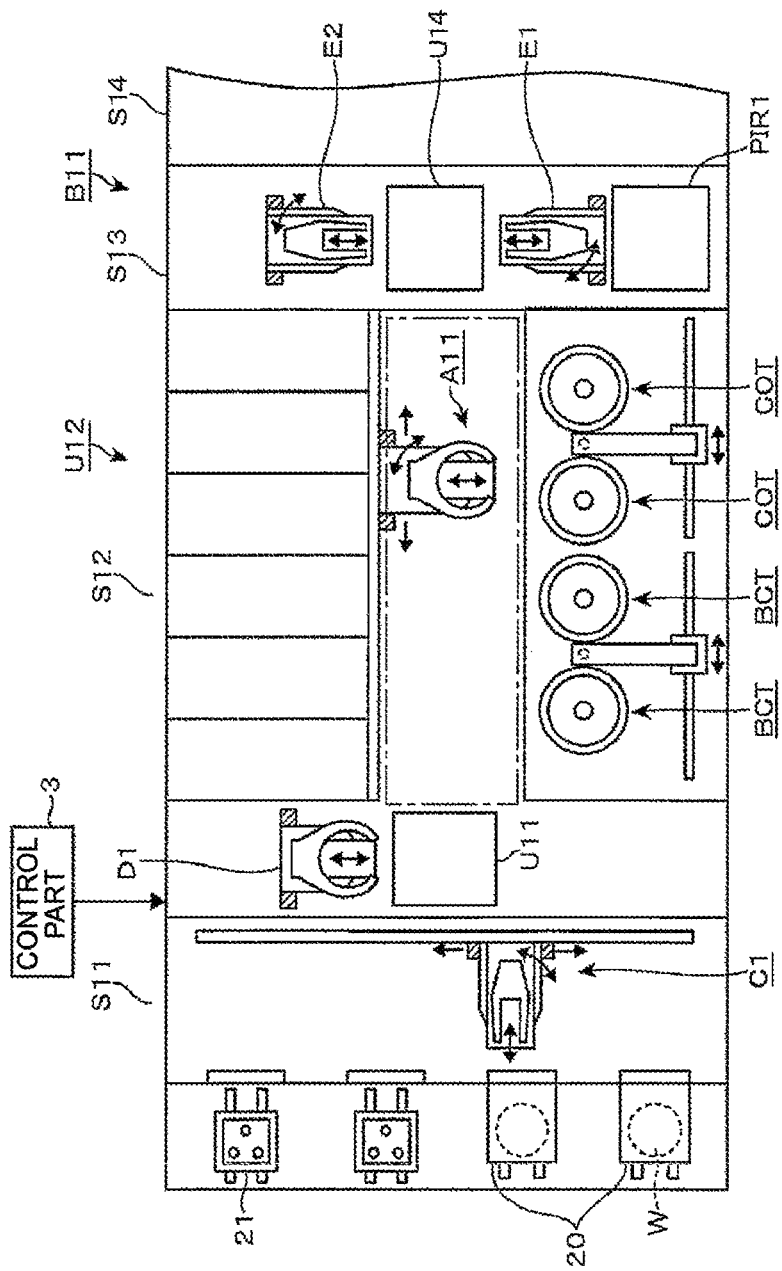
FIG. 22 is a plan view illustrating the resist pattern forming apparatus.
Figure 23:
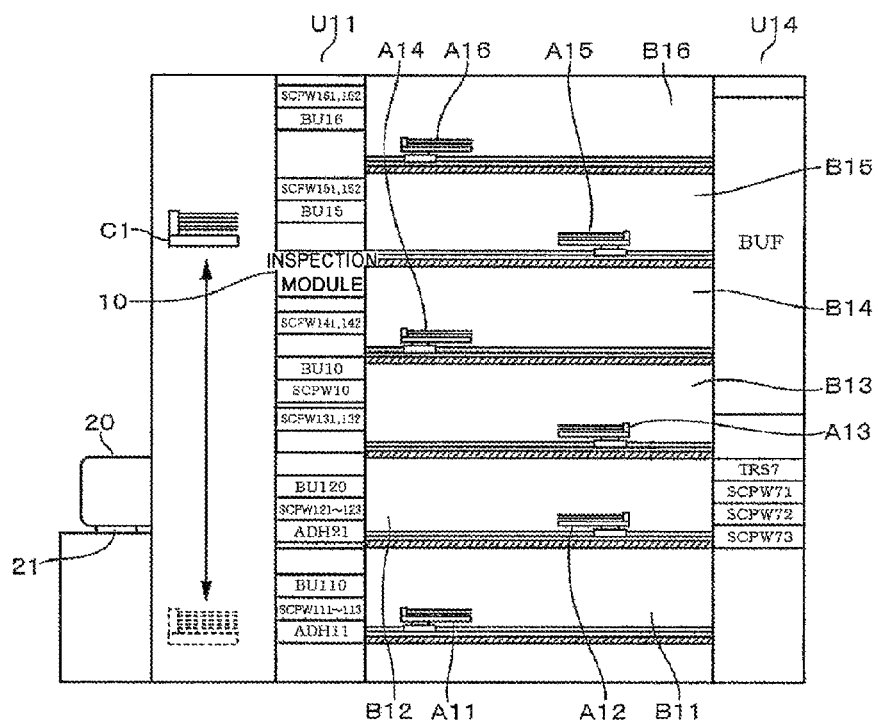
FIG. 23 is a vertical cross-sectional view illustrating the resist pattern forming apparatus.
Figure 24:
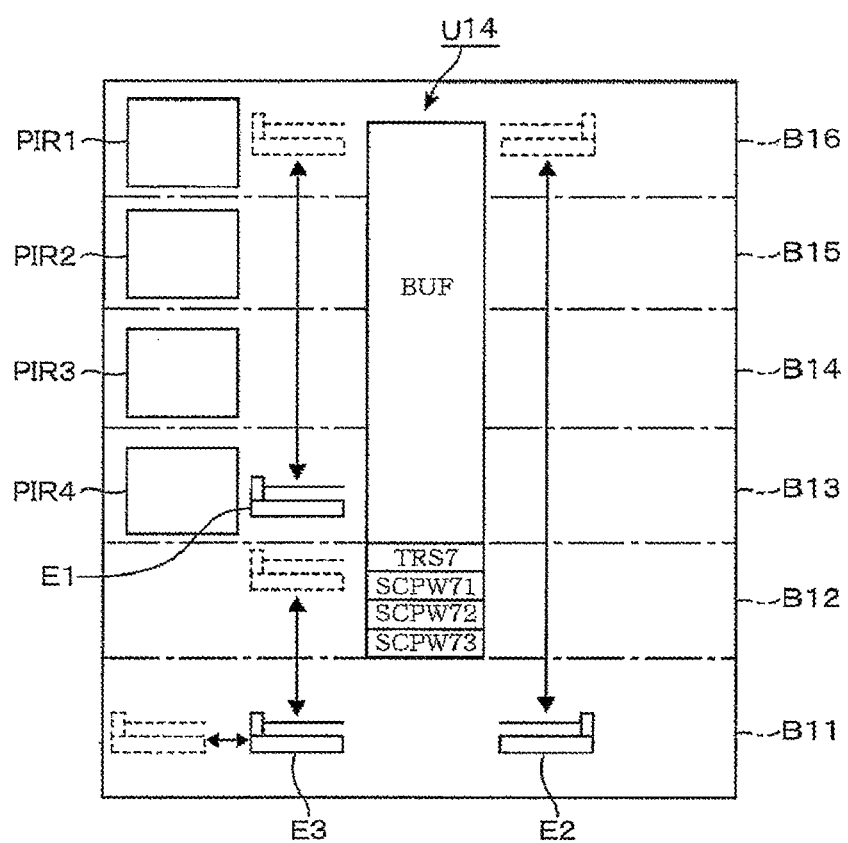
FIG. 24 is a vertical cross-sectional view illustrating an interface block of the resist pattern forming apparatus.

Further, the transportation of the aborted wafer of the coating and development device in which one liquid module is provided in each layer is described, but the transportation of the aborted wafer can be applied to even the coating and development device in which a plurality of liquid processing modules are provided in one layer described in FIGS. 22 to 24. However, in the coating and development device of FIGS. 22 to 24, a passivation film forming module TCT forming a water repellent passivation film with respect to a liquid used in liquid immersion exposure, for example, deionized water is provided. Similarly as the resist film forming module COT, even the passivation film forming module TCT may include the thinner discharging nozzle in addition to the substrate holding section and the nozzle discharging the chemical liquid for forming the passivation film.

In addition, when the passivation film forming module TCT becomes the disabled module, spin coating is performed with the respect to the aborted wafer by the thinner and the passivation film is removed. In this case, the resist film is removed together with the passivation film. Accordingly, when the aborted wafer is continuously to be subjected to coating and development process, for example, the buffer module for storing the aborted wafer is provided in shelf unit and is on standby in shelf unit U11 similar to the coating and development device of FIG. 25, and thereafter, the aborted wafer is transported to the usable resist film forming module COT of unit block B11 or B12 through the deliver module SCPW. Thereafter, the abort wafer is transported to the usable passivation film forming module TCT to be continuously subjected to exposure and developing process.

Even in the coating and development device shown in FIGS. 1 to 3, the layers including the passivation film forming module may be stacked in layers B1 to B6. When the passivation film forming module is disabled, the passivation film and the resist film are removed, and a layer with the resist film and a layer with the passivation film are transported in sequence to be continuously subjected to coating and development process, similarly as the above-mentioned example.

Further, in the above-mentioned example, the coating and development device applying and developing the resist as the substrate processing apparatus are described as an example, but the disclosure is not limited thereto, and for example, the coating and development device may be configured as a coating device applying a film other than the resist by using the liquid processing module having the above-mentioned configuration. Specifically, for example, in the coating and development device, a module forming a spin on glass (SOG) film made of SiO$_2$ or a lower film made of, for example, an organic material in the lower layer of the SOG film may be included instead of the resist film forming module and the anti-reflecting film forming module without the unit block performing the development. Even in the coating device mounted with such a module forming the film, the transportation of wafer W may be controlled as described in each exemplary embodiment and the film is removed with respect to the aborted wafer, which is restored in carrier 20 as it is or the film may be formed again. When the SOG film is dried, the SOG film cannot be removed, and as a result, supplying of the chemical liquid stops and thereafter, for example, the SOG film is removed by supplying the thinner before increasing a rotation velocity of the substrate as compared with the case of supplying the chemical liquid in order to spin off and dry a residual chemical liquid. Since the lower film is formed similarly as the anti-reflecting film, and thereafter, heated, the lower film is not removed by the thinner when removing the SOG film. Further, even the lower film may be removed by the thinner in the forming module of the corresponding lower film similarly as the anti-reflecting film or the resist film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method by a substrate processing apparatus transporting substrates to a module group in which each substrate is transported and placed one by one based on a transportation sequence determined by a transportation means and processing the substrates, where the substrate processing apparatus includes:
    a plurality of unit blocks stacked with each other each performing the same processing with respect to the substrates;
    a carry-in module provided in each of the plurality of unit blocks and configured to carry-in a substrate;
    a carry-out module provided in each of the plurality of unit blocks and configured to carry-out a substrate;
    a multi module including a plurality of modules included in the module group, having the same transportation sequence, and performing the same processing with respect to the substrates;
    a rear module provided at a downstream side of the module group; and
    a substrate placing part provided at the downstream side of the module group and configured to dispose a plurality of substrates,
    the method comprising:
    (4) providing the substrates to the carry-in module of each of the plurality of unit blocks alternately in a predetermined sequence in a normal state;
    determining whether one or more modules of the multi module included in a unit block are disabled and, at the same time, one or more modules are usable in the multi module included in the unit block;
    when it is determined that one or more modules of the multi module included in the unit block are disabled and, at the same time, one or more modules are usable in the multi module included in the unit block:
    (5) (5-a) providing the substrates to the carry-in module of each of the plurality of unit blocks in a providing sequence such that a substrate is provided to a selected carry-in module capable of placing the substrate most rapidly among the plurality of unit blocks, the providing sequence being different from the predetermined sequence of the normal state;
    (5-b) in each of the plurality of unit blocks, transporting the substrates sequentially to the module group of the unit block with the carry-in module by the transportation means to be delivered to the carry-out module according to the providing sequence of the substrates to the carry-in module;
    (5-c) extracting the substrates from the carry-out module; and
    (5-d) transporting the substrates either directly to the rear module from the carry-out module or to the rear module after transporting the substrates to the substrate placing part first, thereby transporting the substrates to the rear module according to the predetermined sequence in which the substrates are provided to the carry-in module in the normal state while ignoring the providing sequence of the substrates generated when one or more modules of the multi module included in the unit block are disabled such that a total processing time is reduced as compared to a case in which the substrates are processed only with the predetermined sequence.

2. The substrate processing method of claim 1, further comprising allocating the sequence to the substrates, extracting the substrate from one module by the transportation means in the unit block so as to transport the substrate recorded in the transportation cycle data to the module corresponding to the substrate by referring to a transportation schedule prepared by arranging transportation cycle data designating a transportation cycle in time series by making the sequence of the substrate and each module to correspond to each other, receiving a substrate of a next module and delivering the previous substrate to the next module, such that the substrate placed in each module is shifted to a one-later module to execute one transportation cycle, and after the one transportation cycle is executed, executing the next transportation cycle, and by sequentially executing each transportation cycle, transporting the substrates sequentially to a high-order module from a low-order module among the module groups to be subjected to predetermined processing, and
    the method further comprising, when one or more modules becomes the disabled modules and one or more modules become the usable modules in the multi-module included in the unit block,
    (6) (6-a) re-recording the transportation schedule so as not to transport the substrate to the disabled module in the unit block where the module is disabled, and
    (6-b) when the substrate which is carried in to the carry-in module in the plurality of unit blocks is different from a substrate placed in the carry-in module in the plurality of unit blocks in the transportation schedule used at that time, re-recording the transportation schedule so that the substrate carried in to the carry-in module is the same as the substrate placed in the carry-in module in the transportation cycle.

3. The substrate processing method of claim 2, wherein:
    the multi module is a coating film forming module configured to form the coating film on the substrate,
    the method further comprising forming the coating film by applying a chemical liquid to the substrate by a coating film forming mechanism provided in a coating film forming module and removing the coating film of the substrate carried in to the disabled module by using the coating film removing mechanism when the coating film forming module is the disabled module, and the operation (5) is performed except for the substrate.

4. The method of claim 3, further comprising:

transporting the substrate where the coating film is removed by the coating film removing mechanism of the disabled coating film forming module to a usable coating film forming module of the unit block including the disabled coating film forming module or a usable coating film forming module of another unit block;

forming the coating film on the substrate again in the coating film forming module; and transporting the substrate where the coating film is formed again to the rear module.

5. The substrate processing method of claim 1, wherein:

the multi module is a coating film forming module configured to form the coating film on the substrate, the method further comprising forming the coating film by applying a chemical liquid to the substrate by a coating film forming mechanism provided in a coating film forming module and removing the coating film of the substrate carried in to the disabled module by using the coating film removing mechanism when the coating film forming module is the disabled module, and the operation (5) is performed except for the substrate.

* * * * *